(12) United States Patent
Tajima

(10) Patent No.: US 10,454,465 B2
(45) Date of Patent: Oct. 22, 2019

(54) SEMICONDUCTOR DEVICE, LOAD DRIVING SYSTEM, AND METHOD OF CURRENT SENSING OF INDUCTOR CURRENT

(71) Applicant: RENESAS ELECTRONICS CORPORATION, Tokyo (JP)

(72) Inventor: Hideyuki Tajima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/224,039

(22) Filed: Dec. 18, 2018

(65) Prior Publication Data

US 2019/0238124 A1 Aug. 1, 2019

(30) Foreign Application Priority Data

Jan. 29, 2018 (JP) ................... 2018-012966

(51) Int. Cl.

| | |
|---|---|
| *H03B 1/00* | (2006.01) |
| *H03K 3/00* | (2006.01) |
| *H03K 17/082* | (2006.01) |
| *G01R 19/32* | (2006.01) |
| *G01K 3/14* | (2006.01) |
| *B60R 16/02* | (2006.01) |
| *F16D 48/06* | (2006.01) |
| *H03K 17/08* | (2006.01) |

(52) U.S. Cl.
CPC ........... *H03K 17/0822* (2013.01); *G01K 3/14* (2013.01); *G01R 19/32* (2013.01); *B60R 16/02* (2013.01); *F16D 48/066* (2013.01); *H03K 2017/0806* (2013.01); *H03K 2217/0063* (2013.01); *H03K 2217/0072* (2013.01)

(58) Field of Classification Search
USPC ......................................... 327/108, 110, 112
See application file for complete search history.

(56) References Cited

U.S. PATENT DOCUMENTS

| | | | |
|---|---|---|---|
| 8,421,441 B2 | 4/2013 | Hirotsu et al. | |
| 8,598,942 B2 | 12/2013 | Kawashima | |
| 2005/0099751 A1* | 5/2005 | Kumagai | H03K 17/0828 361/100 |
| 2014/0145779 A1* | 5/2014 | Gediga | H03K 17/0828 327/378 |
| 2017/0212154 A1 | 7/2017 | Otsuka et al. | |

FOREIGN PATENT DOCUMENTS

| | | |
|---|---|---|
| JP | 2011-097434 A | 5/2011 |
| JP | 5590240 B2 | 9/2014 |
| JP | 2017-129528 A | 7/2017 |

\* cited by examiner

*Primary Examiner* — Anh Q Tra
(74) *Attorney, Agent, or Firm* — McDermott Will & Emery LLP

(57) ABSTRACT

In one semiconductor chip, driving transistors, a current sensor, and a temperature sensor for sensing a temperature of a driver area are arranged in a driver area, and a current sensing circuit, an analog-digital converter, and a temperature sensor for sensing a peripheral circuit area are arranged in a peripheral circuit area. A correction circuit unit corrects a digital sensed voltage from the analog-digital converter based on a sensing result of the temperature sensor of the driver area and a sensed result of the temperature sensor of the peripheral circuit area.

20 Claims, 18 Drawing Sheets

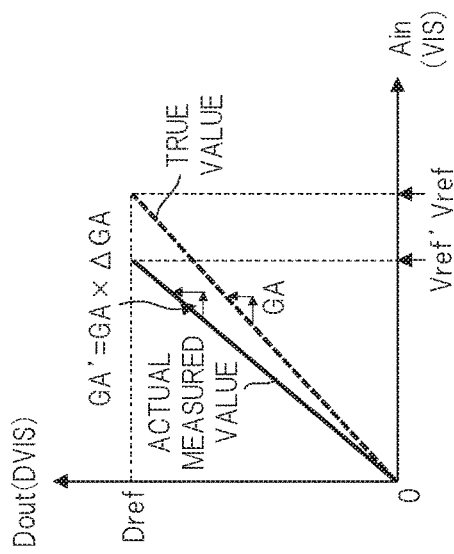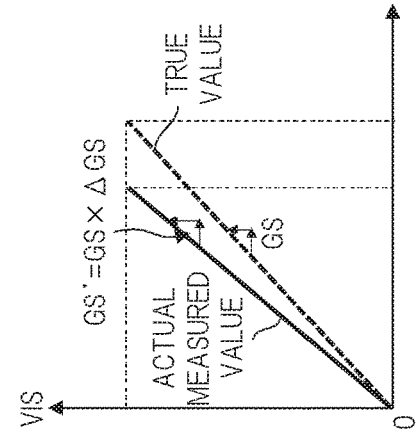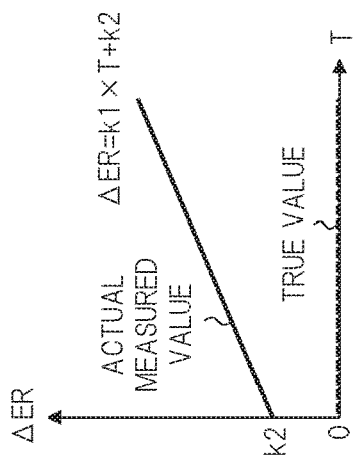

SEMICONDUCTOR DEVICE, LOAD DRIVING SYSTEM, AND METHOD OF CURRENT SENSING OF INDUCTOR CURRENT

CROSS-REFERENCE TO RELATED APPLICATION

The present application claims priority from Japanese Patent Application No. 2018-012966 filed on Jan. 29, 2018, the content of which is hereby incorporated by reference into this application.

TECHNICAL FIELD OF THE INVENTION

The present invention relates to a semiconductor device, a load driving system and a method of current sensing: of an inductor current. The present invention relates to a technology of controlling an inductor current flowing through an inductor to be a load by PWM (pulse width modulation), for example.

BACKGROUND OF THE INVENTION

Japanese Patent Application Laid-Open Publication No. 2017-129528 (Patent Document 1) discloses a current sensing circuit including a sensing resistor for sensing a current of a solenoid valve, an amplifier unit for amplifying a sensed voltage of the sensing resistor, an AD converter for outputting a sensed current value as it digitally converts an output of the amplifier unit, and a correction unit. The correction unit includes a memory for memorizing information of a temperature characteristics of the sensed current value occurring due to temperature characteristics of a reference current (reference voltage) of the AD converter and a temperature sensor, the correction unit correcting the sensed current value from the AD converter based on a sensed result of a temperature sensor and information of the memory unit.

Japanese Patent Publication No. 5590240 (Patent Document 2) discloses a configuration including a power semiconductor device having a sensing function and including a main transistor, a sensing transistor, and a temperature sensing diode, a current-voltage converting circuit for converting a current of the sensing transistor into a voltage, a variable voltage source for adjusting a sensing voltage from the current-voltage converting circuit, and a correction operating unit. The correction operating unit corrects variations of a current sense ratio in accordance with temperature by controlling the variable voltage source by a calculating result obtained by an operation with a set value preliminarily saved in a memory.

Japanese Patent Application Laid-Open Publication No. 2011-97434 (Patent Document 3) discloses a current-controlling semiconductor element including a high-side MOSFET coupled to a solenoid, a current-voltage converting circuit for sensing a current of the high-side MOSFET via a sensing MOSFET and a sensing resistor, an AD converter for digitally converting a voltage converted by the current-voltage converting circuit, a reference-current generating circuit, a correction-value calculating circuit, and a temperature sensor. The correction-value calculating circuit activates a correction-value calculating operation for correcting an influence of temperature variations of the sensing resistor and so forth when the temperature sensed by the temperature sensor is varied by more than a predetermined temperature. In the correction-value calculating operation, a correction value for correcting a digital value from the AD converter is calculated by measuring a constant current from the reference-current generating circuit using the AD converter via the current-voltage converting circuit.

SUMMARY OF THE INVENTION

Generally, in the field of power electronics, there is a widely used system for feedback control of an inductor current flowing through an inductor by PWM control of a switching element. In such a system, it is necessary to sense an inductor current using a current sensor such as those represented by the shunt resistance of Patent Document 1 and the sensing transistors of Patent Documents 2 and 3. In such a situation, to perform a highly accurate control by the system, it is desired to sense an inductor current highly accurately.

On the other hand, in such a case that a driver unit including a transistor for load drive, when a current sensor, a processing unit (AD converter etc.) for processing a sensed value of the current sensor are mounted in one semiconductor chip, a temperature difference occurs between a periphery of the current sensor and a periphery of the processing unit. As a result, there is a fear that the system's correction accuracy, and further, sensing accuracy of inductor current may be insufficient in the method of correcting characteristics of the AD converter using the temperature sensor like Patent Document 1 and the method of correcting variations of the current sensing ratio using the temperature sensing diode like Patent Document 2.

The embodiments described below have been made in view of such considerations, and other problems and novel characteristics will be apparent according to the descriptions of the present specification and attached drawings.

A semiconductor device according to an embodiment A semiconductor device is formed in one semiconductor chip and includes a first area, a second area, and a correction circuit part. A driving transistor to form a current path of an inductor current to flow through the inductor, a current sensor for sensing the inductor current, and a first temperature sensor for sensing temperature of the first area and outputting a first temperature signal to show the temperature are arranged in the first area. A current sensing circuit, an analog-digital converter, and a second temperature sensor are arranged in the second area. A sensed value of the current sensor is inputted to the current sensing circuit and a sensed voltage corresponding to the sensed value is outputted from the current sensing circuit. The sensed voltage is inputted to the analog-digital converter and a digital sensed voltage is outputted after digitally converting the sensed voltage according to a reference value applied as a scale mark. The second temperature sensor senses temperature of the second area and outputs a second temperature signal showing the temperature. The correction circuit part corrects the digital sensed voltage based on the first and second temperature signals.

According to the embodiment, an inductor current can be sensed highly accurately.

BRIEF DESCRIPTIONS OF THE DRAWINGS

FIG. 9A is a diagram illustrating an example of an operation principle of a correction circuit unit in FIG. 4;

FIG. 9B is a diagram illustrating an example of an operation principle of the correction circuit unit in FIG. 4;

FIG. 9C is a diagram illustrating an example of an operation principle of the correction circuit unit in FIG. 4;

DESCRIPTIONS OF THE PREFERRED EMBODIMENTS

The following embodiment will be, if necessary for convenience, described by being divided into a plurality of embodiments or sections. However, unless otherwise stated, they are not unrelated to each other, and are in a relationship in which one is a variation, details, or a supplementary explanation of a part or all of the other one. In addition, in the following embodiment, when referring to the number of elements and the like (including number of pieces, numerical value, amount, range, etc.), unless otherwise stated or clearly limited to a specific number in principle, they are not limited to the specific number and may be more or less than the specific number.

Furthermore, in the following embodiment, it goes without saying that, unless otherwise stated or clearly considered to be essential in principle, the components thereof (including component steps, etc.) are not necessarily essential. Similarly, in the following embodiment, when referring to the shapes, positional relationship and the like of the components, unless otherwise stated and clearly considered to be a different case in principle, components and the like the shape and the like of which are substantially similar or proximate to that of the embodiment are included. The same is true for the numerical value and range described above.

Also, the same components are denoted by the same reference symbols throughout the drawings for describing the embodiments, and a repetitive description thereof is omitted.

First Embodiment

<<Summary of Load Drive System (First Embodiment)>>

Figure 1:
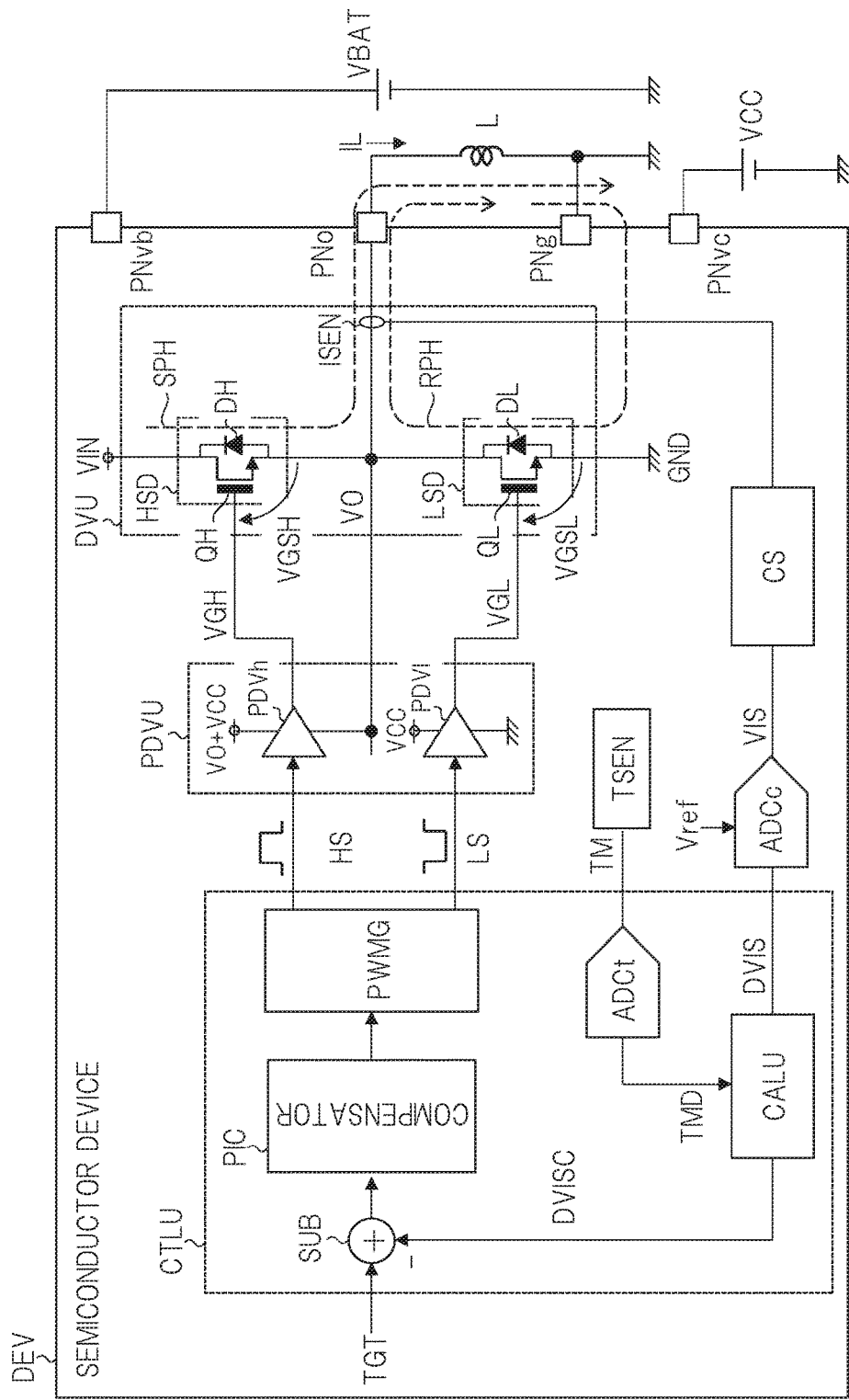
FIG. 1 is a circuit block diagram illustrating a configuration example of a main part of a load drive system according to a first embodiment of the present invention.

FIG. 1 is a circuit block diagram illustrating a configuration example of a main unit of a load drive system according to a first embodiment of the present invention. The load drive system illustrated in FIG. 1 includes, for example, a semiconductor device DEV formed of one semiconductor chip, an inductor L to be a load and driven by the semiconductor device DEV, a battery power for generating a battery power potential VBAT, and a power for chip for generating a power potential for chip VCC. The battery power potential VBAT is, for example, 5V to 45V, and it is typically 13V and so forth. The power potential VCC for chip is, for example, several volts, and it is typically 3.3V and so forth.

The semiconductor device DEV includes power terminals PNvb, PNvc and PNg, to be external terminals, an output terminal PNo, a driver unit DVU, a pre-driver unit PDVU, a current sensing circuit CS, a temperature sensor TSEN, an analog-digital converter ADCc, and a control circuit unit CTLU. The control circuit unit includes an analog-digital converter ADCt, a correction circuit unit CALU, a PWM signal generating circuit PWMG, a compensator PIC, and an error sensor SUB. The battery power potential VBAT is applied to the power terminal PNvb. The power potential for chip VCC is applied to the power terminal PNvc. a ground power potential GND is applied to the power terminal PNg. To the output terminal PNo, the inductor L to be a load is coupled.

The driver unit DVU includes a high-side driver HSD including a high-side transistor QH and a freewheel diode DH, a low-side driver LSD including a low-side transistor QL and a freewheel diode DL, and a current sensor ISEN. The high-side transistor QH and the low-side transistor QL are, in this example, n-channel type MOSFETs.

The high-side transistor QH and the freewheel diode DH are coupled between a high-side power potential VIN and the output terminal PNo in parallel. The high-side power potential VIN is, for example, a potential that is a potential obtained by stabilizing the battery power potential VBAT by a power regulator and is approximately the same potential as the battery power potential VBAT. The low-side transistor QL and the freewheel diode DL are coupled between the output terminal PNo and the ground power potential GND in parallel. The current sensor ISEN is, for example, a sensing transistor or a sensing resistor element etc., and it senses an inductor current IL.

The high-side transistor QH and the low-side transistor QL function as driving transistors forming a current path of the inductor current IL flowing through the inductor L when they are controlled to be turned on. The high-side transistor QH is controlled by a PWM signal and, when it is controlled to be on, accumulates power in the inductor L via a current path SPH. On the other hand, the low-side driver LSD is controlled to be on and off complimentarily to the high-side transistor QH and it freewheels the inductor current IL via a current path RPH when it is controlled to be on. In the present specification, the inductor current IL flowing through a current path SPH will be called "drive current" and the inductor current IL flowing through the current path RPH will be called "freewheel current." The low-side transistor QL performs a synchronous rectification when it is controlled to be on and makes a freewheel current flow replacing the freewheel diode DL.

A sensed value of the current sensor ISEN is inputted to the current sensing circuit CS and a sensed voltage VIS corresponding to the sensed value is outputted from the current sensing circuit CS. The sensed voltage VIS is inputted to the analog-digital converter ADCc and the analog-digital converter ADCc digitally converts the sensed voltage VIS according to a reference value (for example, reference voltage Vref) applied as a scale mark and outputs a digital sensed voltage DVIS. While it will be described in more detail, the temperature sensor TSEN senses temperature in a predetermined range and outputs a temperature signal TM showing the temperature. The analog-digital converter ADCt digitally converts the temperature signal TM and outputs a digital temperature signal TMD. The correction circuit unit CALU corrects, while it will be described in more detail, the digital sensing voltage DVIS based on the digital temperature signal TMS to output a corrected digital sensed voltage DVISC.

The error sensor SUB senses an error between the corrected digital sensed voltage DVISC and a target voltage TGT corresponding to a target current that is preliminary determined. The compensator PIC determines a PWM duty ratio using P (proportion), I (integral) control and for forth so as to make an error between an average value of the corrected digital sensed voltage DVISC (that is, the inductor current IL) and the target voltage TGT (that is, the target current) closer to zero. The PWM signal generating circuit PWMG generates, with reflecting the PWM duty ratio, a high-side switching signal HS to be a PWM signal for controlling on and off of the high-side transistor QH and a low-side switching signal LS to be a compensative signal (in detail, it includes a deadtime period) of the high-side switching signal HS.

The pre-driver unit PDUV includes pre-drivers PDVh and PDV1. The pre-driver PDVh is operated by the power potential (that is, a high-side drive potential "VO+VCC") referring the output potential VO generated at the output terminal PNo as a reference. The pre-driver PDVh, as it receives a high-side switching signal HS, applies a gate potential VGH to be a control input potential to a gate (control input gate) of the high-side transistor QH. In other words, the pre-driver PDVh applies a gate-source voltage VGSH (=VGH−VO) to be an on-off control signal across a gate and a source of the high-side transistor QH.

The pre-driver PDV1 is operated at the power potential VCC referring to the ground power potential GND as a reference. The pre-driver PDV1, as it receives a low-side switching signal LS, applies a gate potential VGL to a gate of the low-side transistor QL. In other words, the pre-driver PDV1 applies a gate-source voltage (on-off control voltage) VGSL (=VGL) across a gate and a source of the low-side transistor QL.

Figure 2:
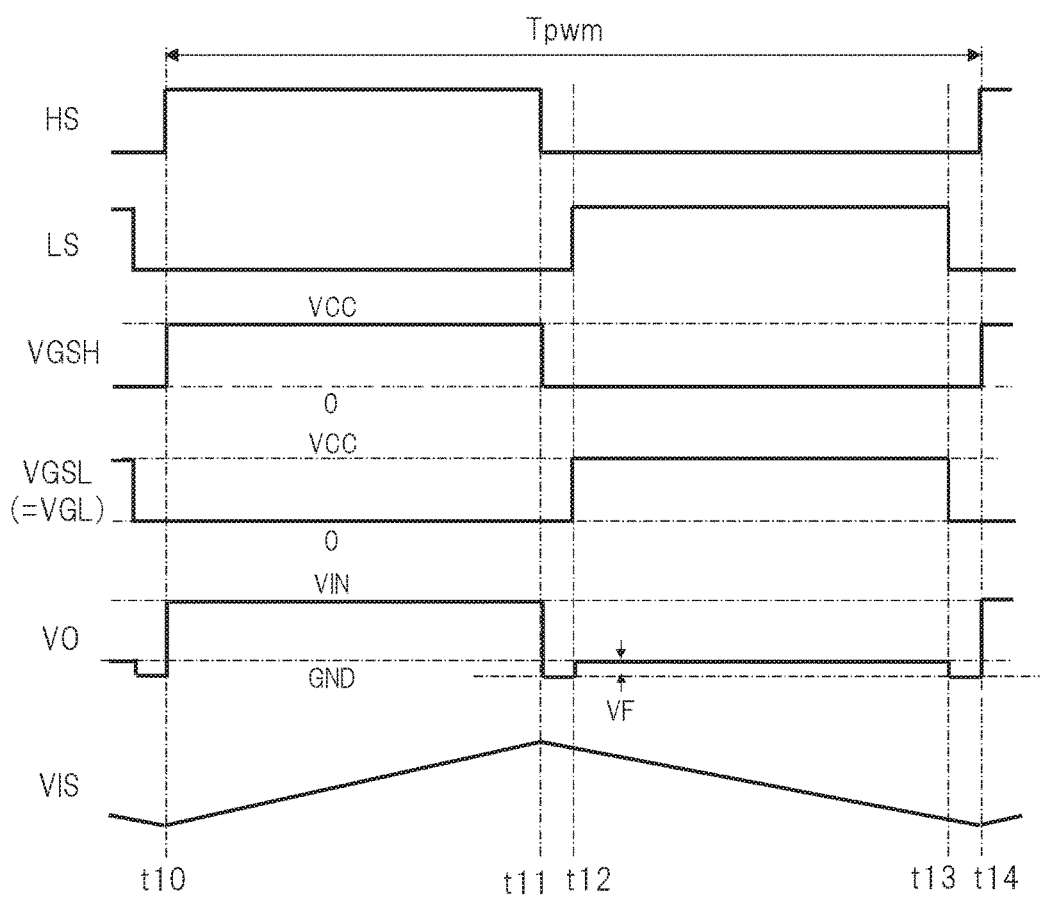
FIG. 2 is a timing chart illustrating an example of a schematic PWM operation of the load drive system of FIG. 1.

FIG. 2 is a timing chart illustrating an example of a schematic PWM operation of the load drive system of FIG. 1. At time t10, when the high-side switching signal HA is transited from an 'L' level (off level) to an 'H' level (on level), the gate-source voltage VGSH of the high-side transistor QH is raised from a zero level to the power potential VCC level. In response to that, a drive current flows in the current path SPH in FIG. 1 and the output potential VO is raised from an approximate ground power potential GND level to a high-side power potential VIN level.

Next, at time t11, when the high-side switching signal HS is transited from the on level to the off level, the gate-source voltage VGSH is dropped to the zero level from the power potential VCC level. In response, the output potential VO is dropped to a level lower than the ground power potential GND level. When the output potential VO reaches a value that is lower by a forward voltage VF referring to the ground power potential GND level as a reference, the freewheel diode DL at the low side is turned on and a freewheel current flows in a current path RPH replacing the current path SPH.

Consequently, at time t12, when the low-side switching signal LS is transited from the off level to the on level, the gate-source voltage VGSL of the low-side transistor QL is raised from the zero level to the power potential VCC level. In response, the low-side transistor QL makes a freewheel current flow replacing the freewheel diode DL. In addition, in accordance to this, the output potential becomes the ground power potential GND.

Next, at time t13, when the low-side switching signal LS is transited from the on level to the off level, the gate-source voltage VGSL of the low-side transistor QL is dropped from the power potential VCC level to the zero level. In response, when the output potential VO is dropped by the forward voltage VF, the freewheel diode DL at the low side makes the freewheel current flow replacing the low-side transistor QL. After that, at time t14, the same operation as that at time t10 is carried out.

In the period from time t10 to time t14, a PWM cycle is Tpwm. The sensed voltage VIS (that is, the inductor current IL) of the current sensing circuit CS is increased at a predetermined gradient in a period in which the output potential VO is at the sigh-side power potential VIN level (time t10 to time t11), and the sensed voltage VIS is lowered at a predetermined gradient in a period in which the output potential VO is at the ground power potential GND level (time t12 to time t13). The analog-digital converter ADCc digitally converts the sensed voltage VIS in a sampling cycle sufficiently shorter than the PWM cycle Tpwm to output the digital sensed voltage DVIS.

<<Summary of a Current Sensing Method (Comparative Example) and Problems>>

Figure 18:
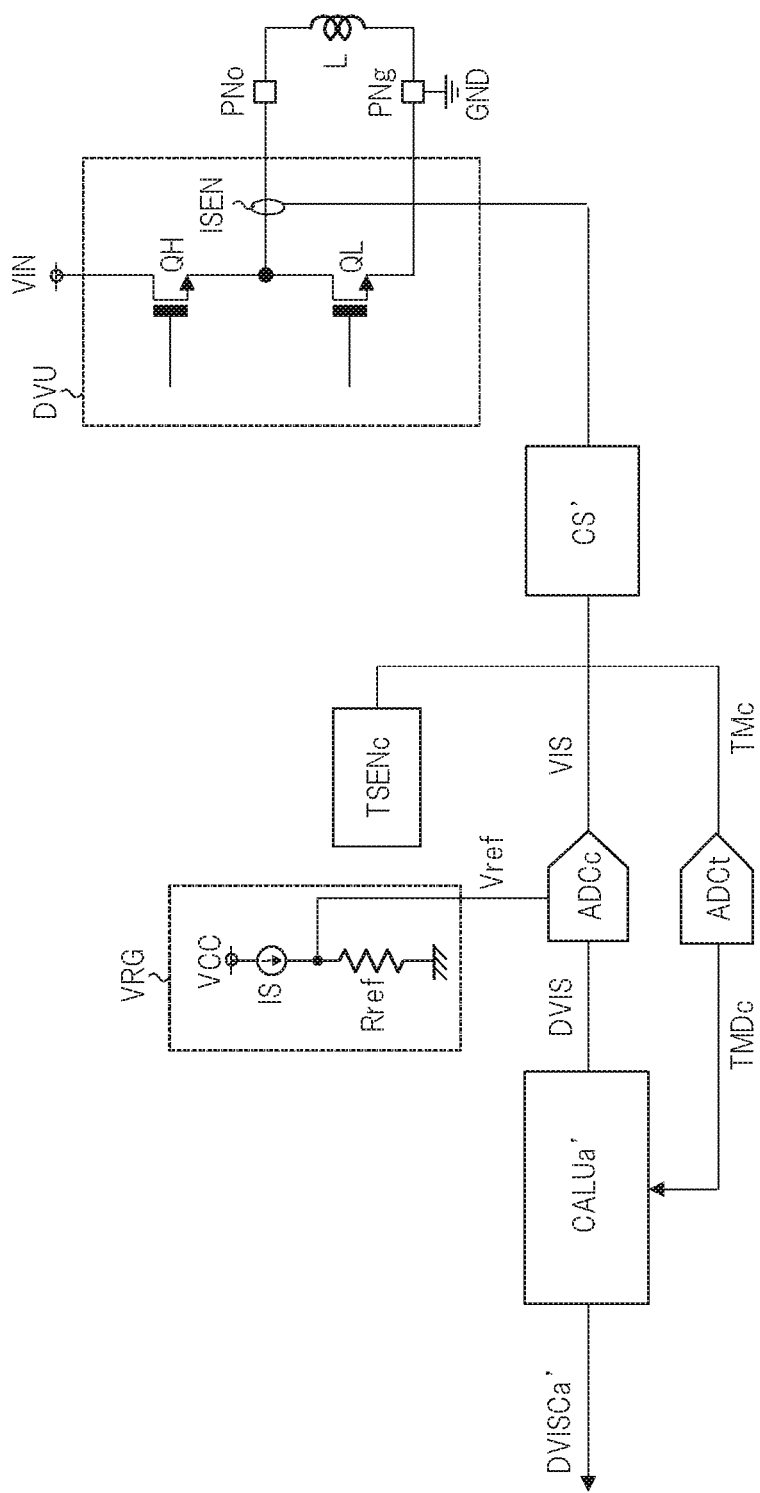
FIG. 18 is a block diagram illustrating a configuration example of a current sensing path in a load drive system studied as a comparative example of the present invention.

FIG. 18 is a block diagram illustrating a configuration example of a current sensing path in a load drive system studied as a comparative example of the present invention. In the example in FIG. 18, one temperature sensor TSENc is provided in one semiconductor chip. The temperature sensor TSENc is provided for, for example, sensing temperature of a reference value generating circuit VRG for generating a reference voltage Vref. An analog-digital converter ADCc digitally converts a sensed voltage VIS from a current sensing circuit CS' referring the reference voltage Vref as a scale mark to output the digital sensed voltage DVIS. The reference value generating circuit VRG includes a constant current source IS and a reference resistance Rref for converting a constant current from the constant current source IS into the reference voltage Vref. The constant current source IS is formed of, for example, one transistor and so forth for current mirroring of a reference current from a reference current generating circuit that is not illustrated in the drawings.

Here, electric characteristics of the constant current source IS and the reference resistance Rref may have a temperature dependency. In this case, as temperature dependency occurs in the reference voltage Vref, a temperature dependency may occur also in the digital sensed voltage DVIS from the analog-digital converter ADCc. Accordingly, a correction circuit unit CALUa' corrects the digital sensed voltage DVIS based on a digital temperature signal TMDc (temperature signal TMc from a temperature sensor TSENc) from an analog-digital converter ADCt to output a corrected digital sensed voltage DVISCa'.

Figure 19:
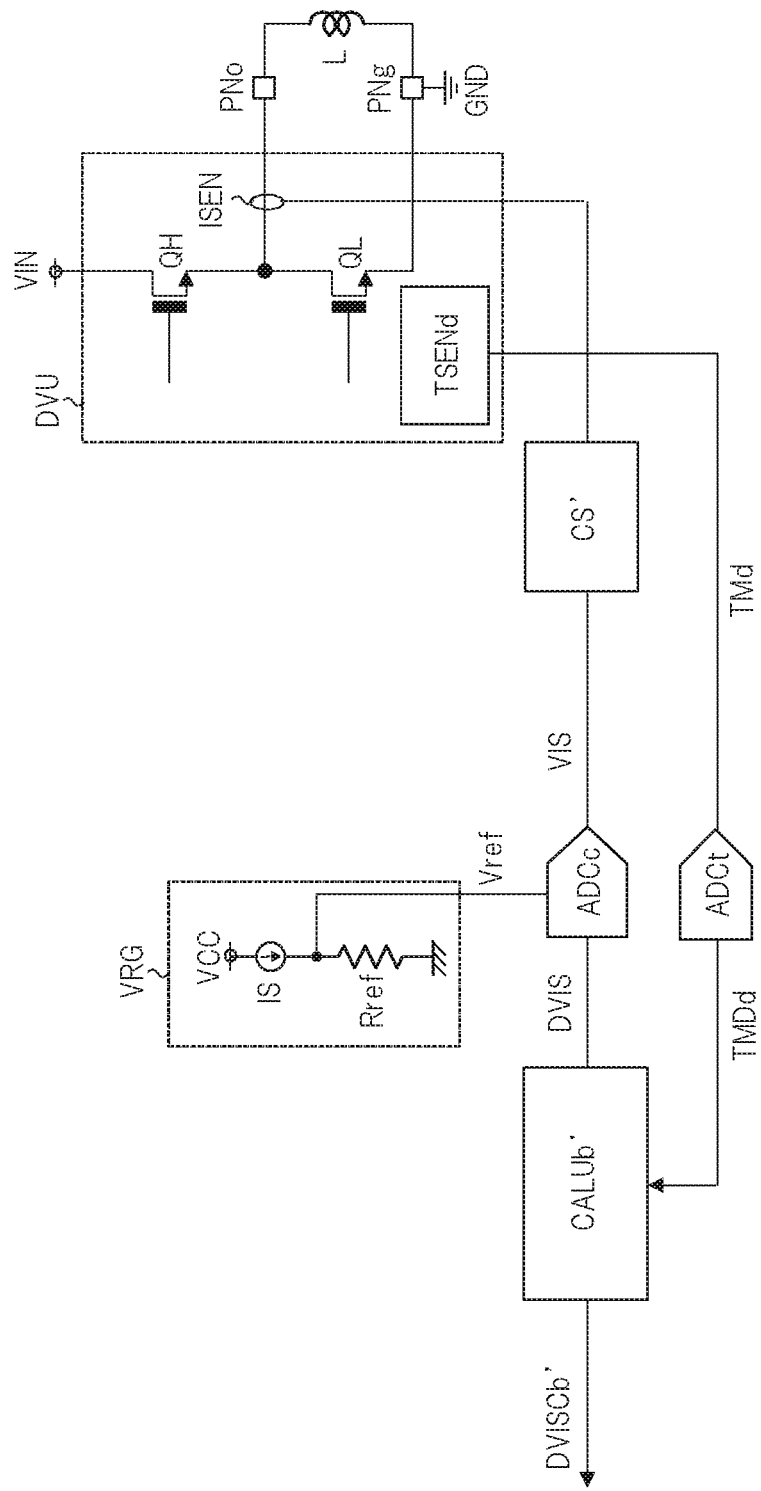
FIG. 19 is a circuit block diagram illustrating a configuration example of a current sensing path that is different from that in FIG. 18 in the load drive system studied as a comparative example of present invention.

FIG. 19 is a circuit block diagram illustrating a configuration example of a current sensing path that is different from that in FIG. 18 in the load drive system studied as a comparative example of present invention. In the example of FIG. 19, different from that of FIG. 18, one temperature sensor TSENd is provided in a driver unit DVU in the semiconductor chip. For example, when the current sensor ISEN is used as a sensing transistor, a temperature dependency may occur in the current sensing ratio of the driving transistors (QH, QL) and the sensing transistor. Accordingly, the correction circuit unit CALUb' corrects the digital sensed voltage DVIS based on a digital temperature signal TMDd (temperature signal TMd from the temperature sensor TSENd) from the analog-digital converter ADCt to output a corrected digital sensed voltage DVISCb'.

Here, when a method of sensing current of FIG. 18 is used, an error in accordance with the current sensing ratio as illustrated in FIG. 19 remains, and when a method of sensing current of FIG. 19 is used, an error in accordance with the analog-digital converter ADCc as illustrated in FIG. 18 remains. Accordingly, for example, performing both of the correction as illustrated in FIG. 18 and the correction illustrated in FIG. 19 based on a temperature signal from one temperature sensor mounted in one semiconductor chip is conceivable. However, as illustrated in FIG. 1, when the driver unit DVU and the current sensing path (CS', ADCc etc.) are mounted in one semiconductor chip, a temperature difference may occur between the periphery of the driver unit DVU and the periphery of the current sensing path. More specifically, there may be a situation in which the periphery of the driver unit DVU becomes a source of heat generation as a large inductor current IL is flowed and, on the contrary, the periphery of the current sensing path is not in a state of high temperature in accordance with a distance etc. (thermal conductivity) from the driver unit DVU etc. on the chip. Therefore, in such a method, a correction accuracy becomes insufficient due to the temperature difference and thus there is a fear that the inductor current cannot sense with a high accuracy.

In addition, instead of using one semiconductor chip in such a way, there is a conceivable method of mounting the driver unit DVU, the current sensing circuit CS', the analog-digital converter ADCc and so forth on different semiconductor chips and temperature sensors are mounted in respective semiconductor chips. However, in such a method, there is a fear that it is difficult to achieve a PWM control at a high speed. That is, since it is necessary to output the sensed voltage VIS in analog outside the semiconductor chip, settling characteristics may be deteriorated due to a parasitic capacitance etc. of an output path of the output and a response speed may be lowered.

In addition, the compensator PIC illustrated in FIG. 1, for example, determines a PWM duty ratio so that an error between an average value of the corrected digital sensed voltage DVISC and a target voltage TGT becomes close to zero. Therefore, when the correction accuracy is insufficient as described above, the error included in the corrected digital sensed voltage DVISC becomes large and the inductor current IL may be controlled to be a value shifted from the target voltage TGT (that is, the target current of the inductor current IL). As a result, there is a fear that it is difficult to control the inductor current IL highly accurately to the target current. Thus, it is beneficial to use a method of an embodiment described below.

<<Summary of a Current Sensing Method (Embodiment)>>

Figure 3:
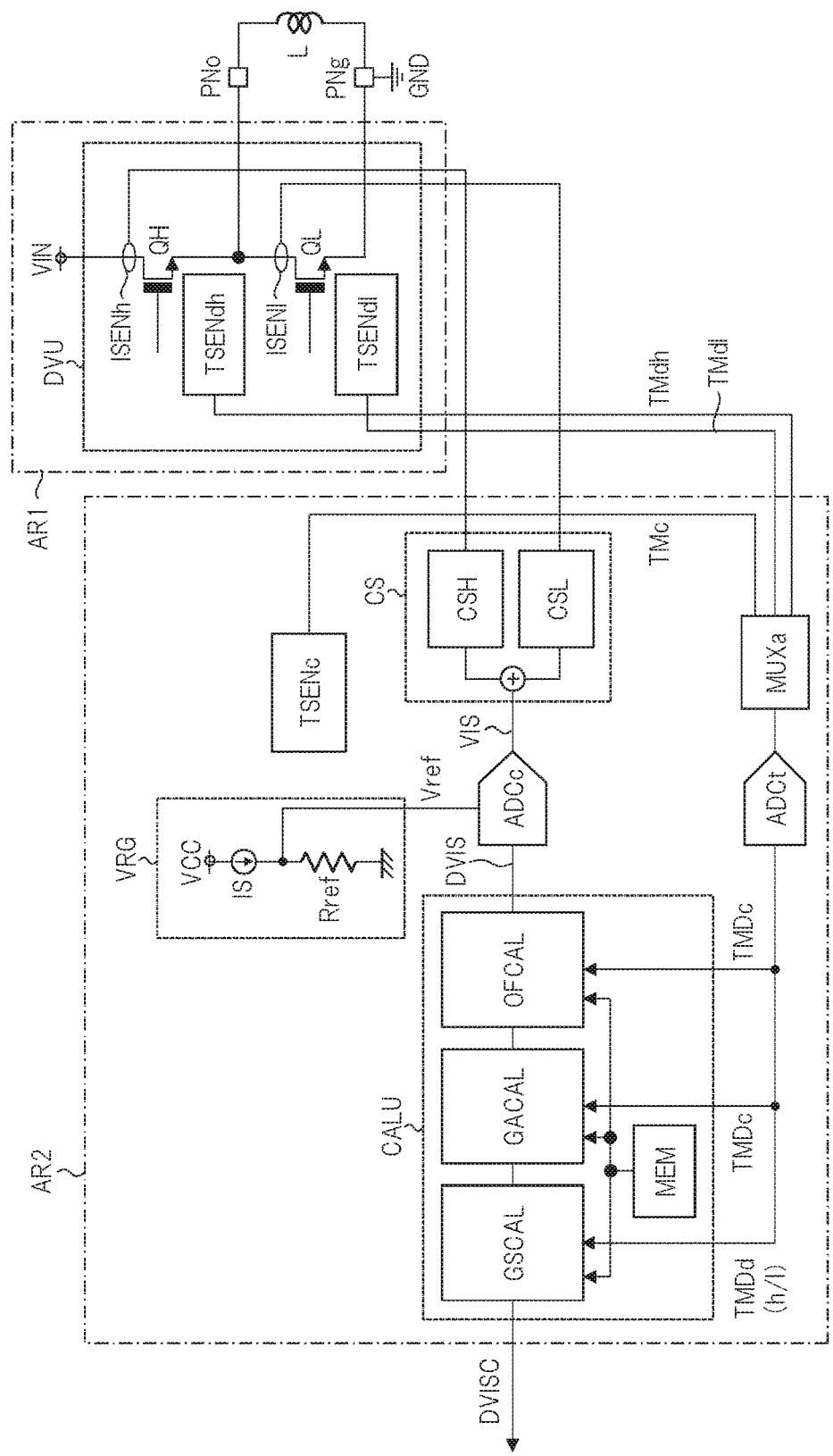
FIG. 3 is a circuit block diagram illustrating a configuration example of a current sensing path in a load drive system according to an embodiment of the present invention.

FIG. 3 is a circuit block diagram illustrating a configuration example of a current sensing path in a load drive system according to an embodiment of the present invention. In FIG. 3, a configuration of a part of the semiconductor device (semiconductor chip) DEV illustrated in FIG. 1 is extracted and illustrated. The semiconductor device DEV in FIG. 1 includes, as illustrated in FIG. 3, a driver area AR1 and a peripheral circuit area AR2 that is an area excluding the driver area AR1.

In the driver area AR1, a driver unit DVU including driving transistors (high-side transistor QH and high-side transistor QL), a current sensor ISENh and ISENl and temperature sensors TSENdh and TSENdl are arranged. The current sensor ISENh senses a driving current (inductor current IL) flowing through the high-side transistor QH and the current sensor ISENl senses a freewheel current (inductor current IL) flowing through the low-side transistor QL. The temperature sensors TSENdh and TSENdl sense temperature of the driver area AR1. More specifically, the temperature sensor TSENdh senses temperature of the current sensor ISENh and outputs a temperature signal TMdh showing the temperature. The temperature sensor TSENdl senses temperature of the current sensor ISENl and outputs a temperature signal TMdl showing the temperature.

In the peripheral circuit area AR2, a current sensing circuit CS, a reference value generating circuit VRG, analog-digital converters ADCc and ADCt, a selection circuit MUXa, a temperature sensor TSENc, and a correction circuit unit CALU are arranged. The current sensing circuit CS includes a high-side current sensing circuit CSH and a low-side current sensing circuit CSL. A sensed value of the current sensor ISENh is inputted to the high-side current sensing circuit CSH and a sensed voltage corresponding to the sensed value is outputted from the high-side current sensing circuit CSH. A sensed value of the current sensor ISENl is inputted to the low-side current sensing circuit CS and a sensed voltage corresponding to the sensed value is outputted from the low-side current sensing circuit CSL. The current sensing circuit CS outputs a sum value of respective sensed voltages from the high-side current sensing circuit CSH and the low-side current sensing circuit CSL as a sensed value VIS.

The analog-digital converter ADCc digitally converts the sensed voltage VIS according to a reference value (for example, a reference voltage Vref) from the reference value generating circuit VRG as described in FIG. 18 referring as a scale mark to output the digital sensed voltage DVIS. The temperature sensor TSENc senses temperature of the peripheral circuit area AR2 and outputs a temperature signal TMc showing the temperature. More specifically, the temperature sensor TSENc mainly senses temperatures of the current sensing circuit CS, the reference value generating circuit VRG, and the analog-digital converter ADCc. Therefore, in the peripheral circuit area AR2 to be a sensing target of the temperature sensor TSENc, it is sufficient when at least the current sensing circuit CS, the reference value generating circuit VRG and the analog-digital converter ADCc are included.

The selection circuit MUXa selects the temperature signals TMdh and TMdl from the temperature sensors TSENdh and TSENdl or the temperature signal TMc from the temperature sensor TSENc. The analog-digital converter ADCt digitally converts a temperature signal from the selection circuit MUXa to output digital temperature signals TMDdh and TMDdl corresponding to the temperature signals TMdh and TMdl and a digital temperature signal TMDc corresponding to the temperature signal TMc. By providing such the selection circuit MUXa, it is possible to perform a digital conversion of a plurality of temperature signals by one analog-digital converter ADCt and thus a reduction of the circuit area and so forth can be achieved.

The correction circuit unit CALU corrects the digital sensed voltage DVIS based on the plurality of digital temperature signals TMDdh, TMDdl, and TMDc from the analog-digital converter ADCt to output a corrected digital sensed voltage DVISC. More specifically, the correction circuit unit CALU includes an offset correction circuit OFCAL, a gain correction circuit [1] GSCAL, a gain correction circuit [2] GSCAL, and a memory circuit MEM. The memory circuit MEM is a non-volatile memory and so forth.

Although details will be described later, the memory circuit MEM preliminary retains offset correction information, ADC gain correction information, and sense gain correction information. The offset correction information mainly shows a temperature dependency of an offset voltage generated by the current sensing circuit CS and/or the analog-digital converter ADCc. The ADC gain correction information mainly shows temperature dependency of an input-output gain of the analog-digital converter ADCc. The sense gain correction information mainly shows temperature dependency of a sensed value of the current sensors ISENh and ISENl.

The offset correction circuit OFCAL corrects the digital sensed voltage DVIS based on the digital temperature signal TMDc showing temperature of the current sensing circuit CS and the analog-digital converter ADCc and the offset correction information in the memory circuit MEM. The gain correction circuit [1] GACAL corrects the digital sensed voltage DVIS based on the digital temperature signal TMDc showing temperature of the analog-digital converter ADCc (and the reference value generation circuit VRG) and the ADC gain information in the memory circuit MEM. On the contrary, the gain correction circuit [2] GSCAL corrects the digital sensed voltage DVIS based on the digital temperature signals TMDdh and TMDdl showing temperatures of the current sensors ISENh and ISENl and the sense gain correction information in the memory circuit MEM.

Here, the selection circuit MUXa performs, for example, a selection operation so that the digital temperature signals TMDdh, TMDdl, and TMDc are updated respectively at regular intervals. For example, the selection circuit MUXa selects the three temperature signals TMdh, TMdl, and TMc in three control cycles, respectively, and, correspondingly, the offset correction circuit OFCAL, the gain correction circuit [1] GACAL and the gain correction circuit [2] GSCAL latch digital temperature signals necessary for themselves. By repeating such processes, each digital temperature signal to be latched by the correction circuit unit CALU is updated at every cycle of a control cycle. In this situation, for example, the update cycle can be suitably set by adjusting a length of the control cycle or the update interval suitably and by providing a dummy control cycle, and so forth.

As described above, the temperature sensors TSENdh, TSENdl, and TSENc are provided in the driver area AR1 and the peripheral circuit area AR2, respectively, and by correcting the digital sensed voltage DVIS based on temperature sensed result of the temperature sensors, the inductor current IL can be sensed with a high accuracy. In other words, since the correction can be performed with reflecting a temperature difference between the driver area AR1 and the peripheral circuit area AR2 as described as in FIGS. 18 and 19, it is possible to improve the correction accuracy. As a result, it becomes possible to control the inductor current IL with high accuracy as compared to a target current. Note that, although two temperature sensors TSENdh and TSENdl are provided here, it is possible to provide one commonalized temperature sensor in accordance with a temperature distribution inside the driver area AR1.

<<Configuration of the Current Sensing Method (Embodiment 1)>>

Figure 4:
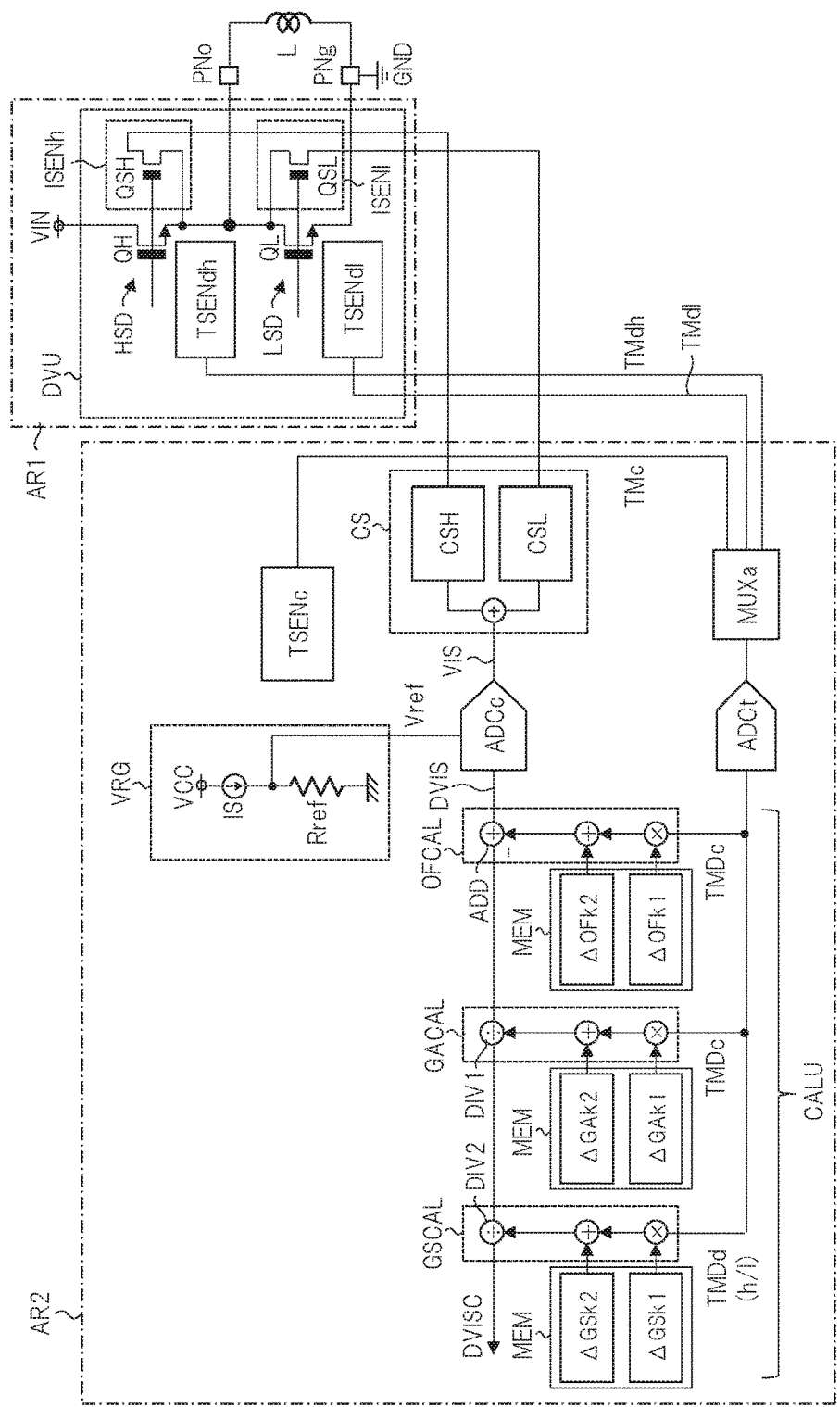
FIG. 4 is a circuit block diagram illustrating a configuration example of a current sensing path in the load drive system according to the first embodiment of the present invention.

FIG. 4 is a circuit block diagram illustrating a configuration example of a current sensing path in the load drive system according to the first embodiment of the present invention. In FIG. 4, as compared to FIG. 3, a configuration example of the current sensors ISENh and ISENl and the correction circuit unit CALU is illustrated in detail. The current sensor ISENh has a predetermined size ratio (for example, several hundredths to several thousandths etc.), and is formed of a low-side sensing transistor QSL controlled to be on and off commonly with the low-side transistor QL.

The memory circuit MEM inside the correction circuit unit retains offset correction information including correction factors $\Delta OFk1$ and $\Delta OFk2$, ADC gain correction information including correction factors $\Delta GAk1$ and $\Delta GAk2$ and sense gain correction information including $\Delta GSk1$ and $\Delta GSk2$. The offset correction circuit OFCAL calculates "$\Delta OFk1 \times TMDc + \Delta OFk2$" using the correction factor in the offset correction information, and subtracts its calculated result from the digital sensed voltage DVIS using an adder ADD.

The gain correction circuit [1] GSCAL calculates "$\Delta GAk1 \times TMDc + \Delta GAk2$" using the correction factor in the ADC gain correction information and subtracts its calculated result from the digital sensed voltage DVIS using a divider DIV1. The gain correction circuit [2] GSCAL calculates "$\Delta GSk1 \times TMDd + \Delta GSk2$" using the correction factor in the sense gain correction information and subtracts its calculated result from the digital sensed voltage DVIS using a divider DIV2.

Note that, in more detail, the sense gain correction information ($\Delta GSk1$ and $\Delta GSk2$) includes a correction factor corresponding to the high-side sensing transistor QSH and a correction factor corresponding to the low-side sensing transistor QSL. The gain correction circuit [2] GSCAL performs, in a period in which a drive current is flowed by the high-side transistor QH (time t10 to t11 in FIG. 2), correction using the correction factor corresponding to the high-side sensing transistor QSH and the digital temperature signal TMDdh. On the other hand, the gain correction circuit [2] GSCAL performs, in a period in which a freewheel current is flowed by the low-side transistor QL (time t12 to t13 in FIG. 2), correction using the correction factor corresponding to the low-side sensing transistor QSL and the digital temperature signal TMDdl.

Figure 5:
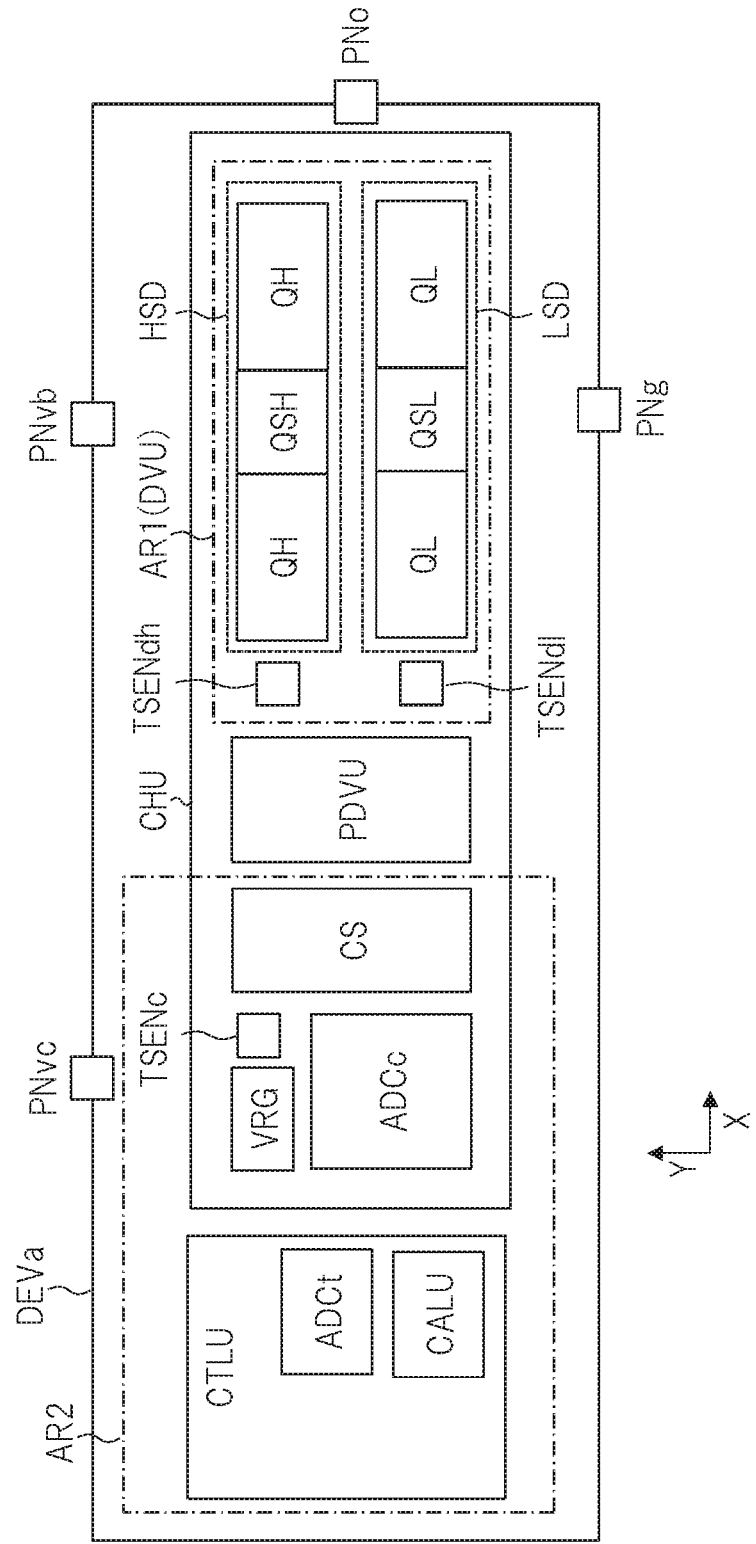
FIG. 5 is a schematic diagram illustrating an arrangement configuration example of respective circuits in a semiconductor device including the current sensing path in FIG. 4.

FIG. 5 is a schematic diagram illustrating an arrangement configuration example of respective circuits in a semiconductor device including the current sensing path in FIG. 4. In a semiconductor device (semiconductor chip) DEVa illustrated in FIG. 5, along an X direction, a driver unit DVD, a pre-driver unit PDVU, a current sensing circuit CS, an analog-digital converter ADCc (and a reference value generating circuit VRG), and a control circuit unit CTLU are arranged in this order. An output terminal PNo is arranged to be close to the driver unit DVU. A channel unit CHU for supplying and sensing current (power) to one output terminal PNo is configured by the driver unit DVD, the pre-driver unit PDVU, the current sensing circuit CS, a reference value generating circuit VRG, and an analog-digital converter ADCc.

Here, in the driver unit DVU (driver area AR1), the temperature sensor TSENdh is arranged to be close to the high-side driver HSD and the temperature sensor TSENdl is arranged to be close to the low-side driver LSD. The high-side driver HSD includes the high-side transistor QH and the high-side sensing transistor QSH. The low-side driver LSD includes the low-side transistor QL and the low-side sensing transistor QSL. In addition, in the peripheral circuit area AR2, the temperature sensor TSENc is arranged to be closed to the current sensing circuit CS, the reference value generating circuit VRG, and the analog-digital converter ADCc.

<<Detailed Configuration of Respective Parts>>

Figure 6:
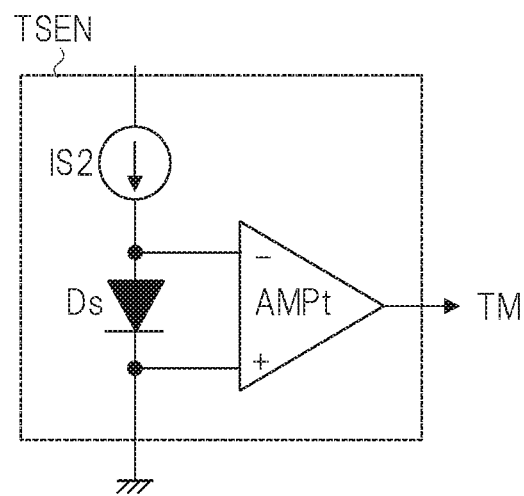
FIG. 6 is a circuit diagram illustrating a configuration example of a current sensor in FIG. 4.

FIG. 6 is a circuit diagram illustrating a configuration example of a current sensor in FIG. 4. The temperature sensor TSEN illustrated in FIG. 6 includes, for example, a diode Ds for sensing temperature, a constant current source IS2 for supplying a constant current to the diode Ds, and an amplifier circuit AMPt sensing and amplifying a forward voltage of the diode Ds and outputting a temperature signal TM. Since the forward voltage of the diode Ds has negative temperature characteristics, temperature can be sensed utilizing the characteristics.

Figure 7:
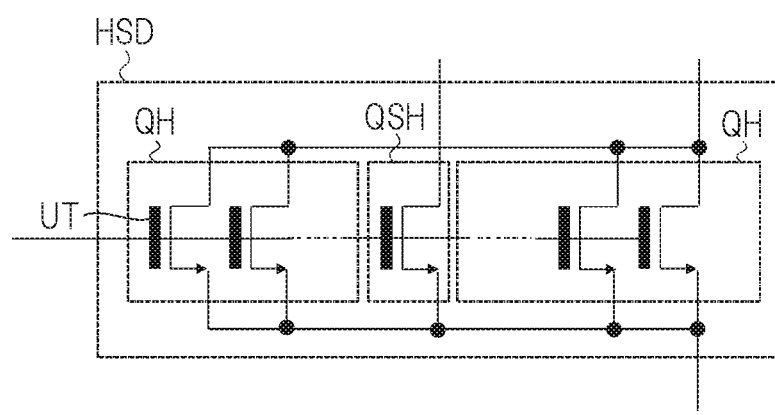
FIG. 7 is a schematic diagram illustrating a configuration example of a high-side driver in FIG. 4.

FIG. 7 is a schematic diagram illustrating a configuration example of the high-side driver in FIG. 4. The high-side driver illustrated in FIG. 7 includes a plurality of (for example, several hundreds to several thousands of) unit transistors UT having an identical structure arranged next to each other. The high-side sensing transistor QSH is configured by some (for example, one) of the unit transistors UT of the unit transistors UT mentioned above. The other unit transistors configure the high-side transistor QH as their respective nodes (gate, source, and drain) are coupled in parallel.

The gate and source of the high-side sensing transistor QSH are coupled to the gate and source of the high-side transistor QH. In this example, to reflect average characteristics of the high-side transistor QH, the unit transistor UT arranged in a vicinity of a center portion is determined as the high-side sensing transistor QSH. Note that, the low-side driver LSD is configured in the same manner as the high-side driver HSD.

Figure 8:
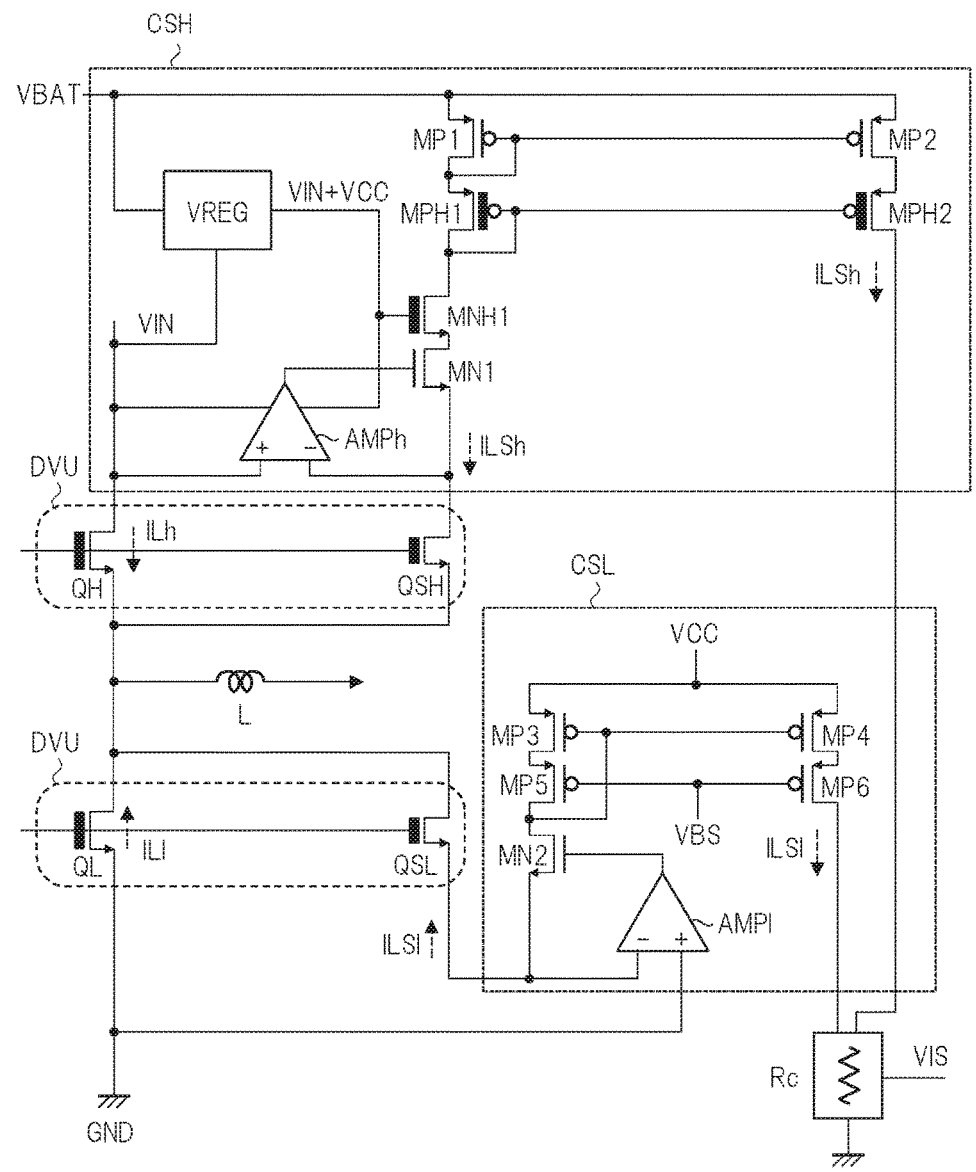
FIG. 8 is a circuit diagram illustrating a configuration example of a current sensing circuit in FIG. 4.

FIG. 8 is a circuit diagram illustrating a configuration example of the current sensing circuit in FIG. 4. In FIG. 8, the high-side current sensing circuit CSH includes a power regulator VREG, an amplifier circuit AMPh, high-voltage transistors MNH1, MPH1, and MPH2, and low-voltage transistors MN1, MP1, and MP2. The transistors MNH1 and MN1 are n-channel type MOSFETs and the transistors MPH1, MPH2, and MP2 are p-channel type MOSFETs.

The power regulator VREG receives a battery power potential VBAT and generates the high-side power potential VIN and a potential "VIN+VCC" by adding the power potential to that. The transistor MN1 is coupled to the high-side sensing transistor QSH in series. The amplifier circuit AMPh controls feedback of a gate potential of the transistor MN1 so that a drain potential of the high-side transistor QH and a drain potential of the hi-side sensing transistor QSH are a same potential. In this manner, when an inductor current (driving current) is flowed through the high-side transistor QH, a high-side sense current ILSh is flowed through the high-side sensing transistor QSH, the high-side sense current ILSh being proportional to the driving current based on a size ratio.

The transistors MP1 and MP2 configure a current mirror circuit (for example, a current ratio is 1 to 1) and transcribe high-side sense current to the transistor MP2 via the transistor MP1. The transistors MNH1 and the transistor MPH1 are coupled between the transistor MN1 and the transistor MP1 in series and play a role of protection from source-drain voltage breakdown. To a gate of the transistor MNH1, the potential "VIN+VCC" from the power regulator VREG is applied. The transistor MPH2 is coupled to the transistor MP2 in series and plays a role of protection from source-drain voltage breakdown. According to such a configuration as described above, the high-side current sensing circuit CSH outputs the high-side sense current ILSh via the transistors MP2 and MPH2.

The low-side current sensing circuit CSL includes an amplifier circuit AMP1, and low-voltage transistors MN2 and MP3 to MP6. The transistor MN2 is an n-channel type MOSFET and the transistor MP3 to MP6 are p-channel type MOSFETs. The transistor MN2 is coupled to the low-side sensing transistor QSL in series. The amplifier circuit AMP1 controls feedback of a gate potential of the transistor MN2 so that a source potential of the low-side transistor QL and a source potential of the low-side sensing transistor QSL are a same potential. Accordingly, when an inductor current (return current) IL1 is flowed through the low-side transistor QL, a low-side sense current ILS1 is flowed through the low-side sensing transistor QSL, the low-side sense current ILS1 being proportional to the return current based on a size ratio.

The transistors MP3 and MP5 configure a two-stage current mirror circuit (for example, current ratio is 1 to 1) with the transistors MP4 and MP6. A predetermined bias voltage VBS is applied to gates of the transistors MP5 and MP6, a drain potential of the transistor MP5 is applied to gates of the transistors MP3 and MP4. The transistors MP3 and MP5 transcribe the low-side sense current ILS1 to the transistors MP4 and MP6. According to such a configuration, the low-side current sensing circuit CSL outputs the low-side sense current ILS1 via the transistors MP4 and MP6. The high-side sense current ILSh from the high-side current sensing circuit CSH and the low-side sense current ILS1 from the low-side current sensing circuit CSL are generated in a period in which they are not overlapped along with switching operations and converted into the sensed voltage VIS via a resistance element R for voltage conversion.

<<Operation Principal of Correction Circuit Unit>>

FIGS. 9A, 9B, and 9C are diagrams illustrating examples of an operation principle of the correction circuit unit in FIG. 4. as illustrated in FIG. 9A, an error component ΔER dependent to temperature T can be approximated by a linear function "k1×T+k2" using a coefficient k1 as a linear coefficient and a coefficient k2 and an offset coefficient. There, regarding the offset correction circuit OFCAL, in the current sensing circuit CS and the analog-digital converter ADC, an offset voltage ΔOF having characteristics as illustrated in FIG. 9A may occur in accordance with a surrounding temperature (Tc) of the current sensing circuit CS and the analog-digital converter ADC. The offset voltage ΔOF occurs mainly from the amplifier circuits AMPh and AMP1 inside the current sensing circuits CS in FIG. 8 and an amplifier circuit (not illustrated) inside the analog-digital converter ADCc etc.

When such an offset voltage ΔOF exists, the digital sensed voltage DVIS becomes a value obtained by adding the offset voltage ΔOF to a true sensed voltage. Accordingly, the offset correction circuit OFCAL corrects to the true sensed voltage by subtracting the offset voltage ΔOF (=ΔOFk1×Tc+ΔOFk2) from the digital sensed voltage DVIS.

Next, regarding the gain correction circuit [2] GSCAL, a current sense ratio of the driving transistors (QH, QL) and sensing transistors (QSH, QHL) may have a temperature dependency in accordance with their surrounding temperature (Td). In this case, as illustrated in FIG. 9B, since a gain of the sensed voltage VIS to the inductor current IL is varied in accordance with the temperature (Td), an actual measured gain GS' is obtained by multiplying a gain error component ΔGS by a true gain GS. The gain error component ΔGS has characteristics as illustrated in FIG. 9A to the temperature (Td). Accordingly, the gain correction circuit [2] GACAL corrects to the true gain GS by dividing the digital sensed voltage DVIS by the gain error component ΔGS (=ΔGSk1×Td+ΔGSk2).

Next, regarding the gain correction circuit [1] GACAL, the reference voltage Vref of the analog-digital converter ADCc may have a temperature dependency in accordance with its surrounding temperature (Tc). In this case, as illustrated in FIG. 9C, since a gain of a digital output Dout (that is, the digital sensed voltage) to an analog input Ain (that is, the sensed voltage VIS) is varied in accordance with a temperature (Tc), an actual measured gain GA' is obtained by multiplying a true gain GA by a gain error component ΔGA. The gain error component ΔGA has characteristics as FIG. 9A to the temperature (Tc). Accordingly, the gain correction circuit [1] GACAL corrects to the true gain GA by dividing the digital sensed voltage DVIS by the gain error component ΔGA (=ΔGAk1×Tc+ΔGAk2).

Note that, in the graph as illustrated in FIG. 9C, a symbol Dref means an ideal digital output value upon inputting the reference voltage Vref to the analog-digital converter ADCc. A symbol Vref' means an actual measured value of reference voltage for the analog-digital converter ADCc of an actual semiconductor device to output an ideal digital output value (Dref). FIG. 9C illustrates that the actual measured value (Vref') of reference voltage has an error to the reference voltage.

<<Method of Determining Correction Factor>>

Figure 10:
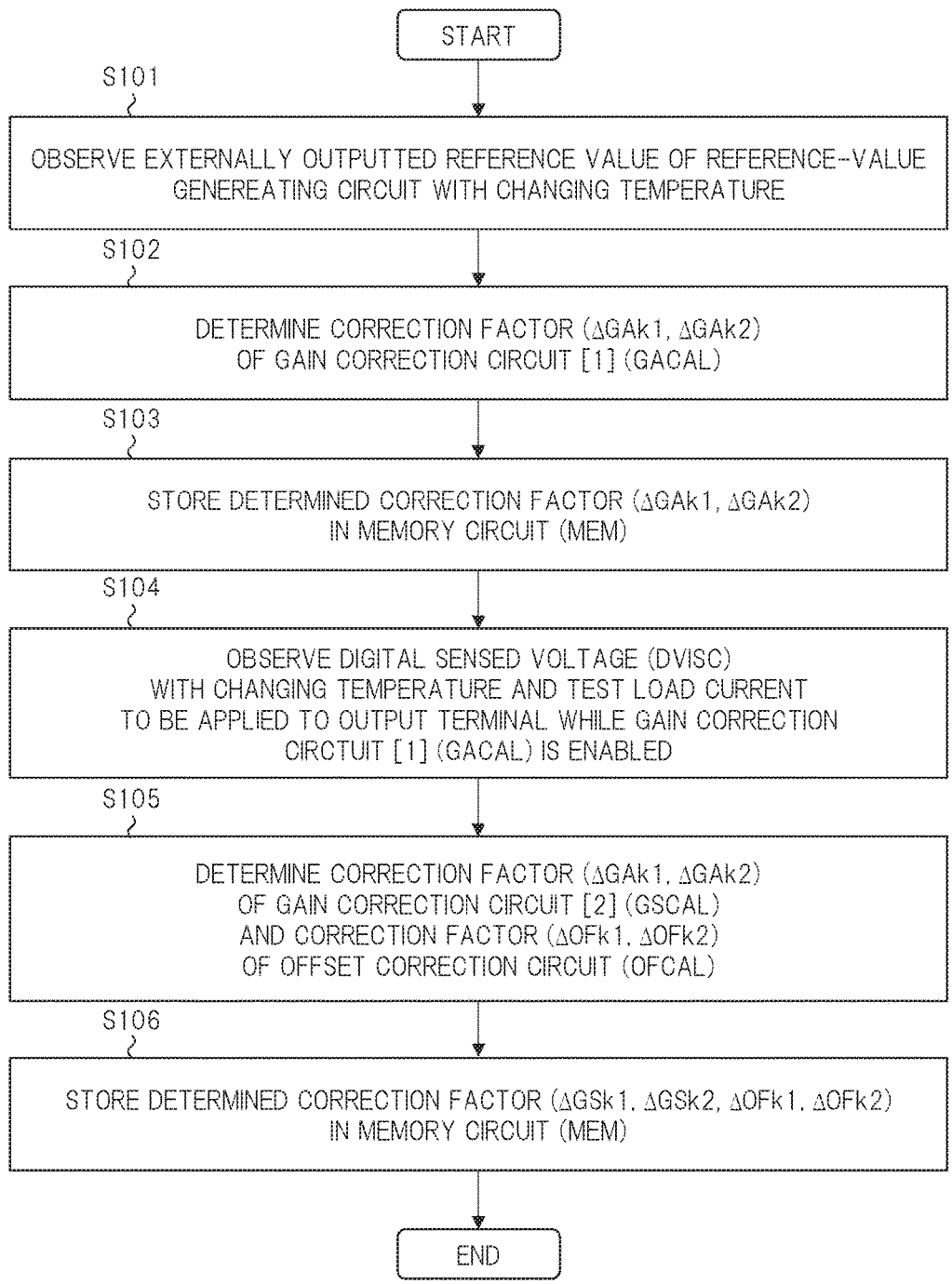
FIG. 10 is a flow chart illustrating an example of a method of determining respective correction factors retained in the correction circuit unit in FIG. 4.

FIG. 10 is a flow chart illustrating an example of a method of determining respective correction factors retained in the correction circuit unit in FIG. 4. In FIG. 10, a predetermined test device observes a temperature dependency of an input-output gain (the gain GA' in FIG. 9C) of the analog-digital converter ADCc by observing a reference value (reference voltage Vref from the reference value generating circuit VRG) to be applied to the analog-digital converter ADCc with changing temperature (step S101). In that situation, in advance, a testing circuit which externally outputs the reference voltage Vref is provided in the semiconductor device DEV. Next, the test device determines, based on an observation result of the step S101, ADC gain correction information (that is, the correction factors (ΔGAk1, ΔGAk2) of the gain correction circuit [1] (step S102) and stores the ADC again correction information in the memory circuit MEM (step S103).

Next, the test device observes a digital sensed voltage VDISC with changing temperature and a testing load current applied to the output terminal PNo respectively having the gain correction circuit [1] GACAL activated (step S104). Then, the test device determines, based on an observation result of the step S104, offset correction information (that is, the correction factors (ΔOFk1, ΔOFk2) of the offset correction circuit OFCAL) and sense gain correction information (that is, correction factors (ΔGSk1, ΔGSk2) of the gain correction circuit [2]) (step S105). The test device stores these determined correction factors (ΔOFk1, ΔOFk2, ΔGSk1, ΔGSk2) in the memory circuit, respectively (step S106).

In the steps S104 and S105, more specifically, the test device observes the digital sensed voltage DVIS with changing temperature while the test load current is set to zero. As a result, mainly, a temperature dependency of the offset voltage occurring in the current sensing circuit CS and the analog-digital converter ADCc are observed. The test device determines offset correction information based on a result of the observation.

Further, the test device measures a gradient of the digital sensed voltage DVIS to the change of the test load current with changing temperature. As a result, mainly, a temperature dependency of a current sense ratio (then the gain GS' in FIG. 9B) of the driving transistors (QH, QL) and the sensing transistors (QSH, QSL) is observed. That is, since a gain error component (ΔGA) along with the analog-digital converter ADCc has been already corrected in accordance with the step S103 etc., here, a gain correction component (ΔGS) along with the sensing transistors (QSH, QSL) is observed. The test device determines sense gain correction information based on a result of the observation.

<<Main Effect of the First Embodiment>>

As described above, by using the method according to the first embodiment, typically, it is possible to sense an inductor current with a high accuracy. As a result, it is possible to control an inductor current with a high accuracy.

Second Embodiment

<<Configuration of a Current Sensing Method (Second Embodiment)>>

Figure 11:
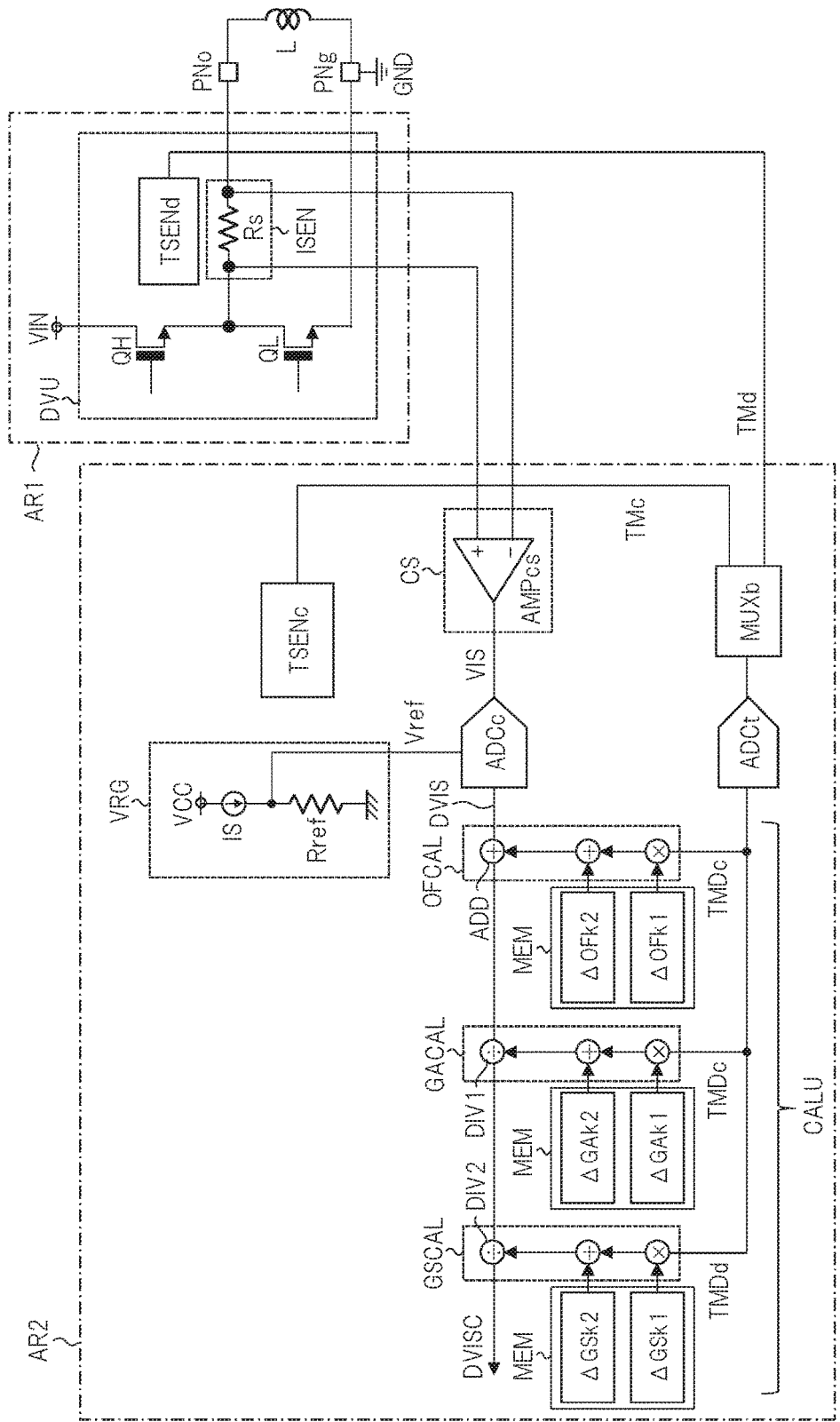
FIG. 11 is a circuit block diagram illustrating a configuration example of a current sensing path in a load drive system according to a second embodiment of the present invention.

FIG. 11 is a circuit block diagram illustrating a configuration example of a current sensing path in a load drive system according to a second embodiment of the present invention. FIG. 11 is different from FIG. 4 by the following points as compared to FIG. 4. As a first difference, the current sensor ISEN in the driver unit DUV is configured by a sensing resistance element Rs coupled to the inductor L in series. Accordingly, in the driver unit DVU, one temperature sensor TSENd for sensing temperature of the sensing resistance element Rs and outputting a temperature signal TMd showing the temperature is provided.

As a second difference, the current sensing circuit CS includes an amplifier circuit AMPcs for amplifying a terminal voltage across the sensing resistance element Rs. As a third difference, a selection circuit MUXb selects a temperature signal TMd from the temperature sensor TSENd or a temperature signal TMc from the temperature sensor TSENc and, accordingly, the gain correction circuit [2] GSCAL latches a digital temperature signal TMDd corresponding to the temperature signal TMd.

A resistance value of the sensing resistance element Rs may have a temperature dependency. In this case, in the same manner as the first embodiment, the gain error component (ΔGS) illustrated in FIG. 9B occurs. Accordingly, the gain correction circuit [2] GSCAL removes the gain error component (ΔGS) based on the temperature signal TMd and sense gain correction information previously retained in the memory circuit MEM.

Figure 12:
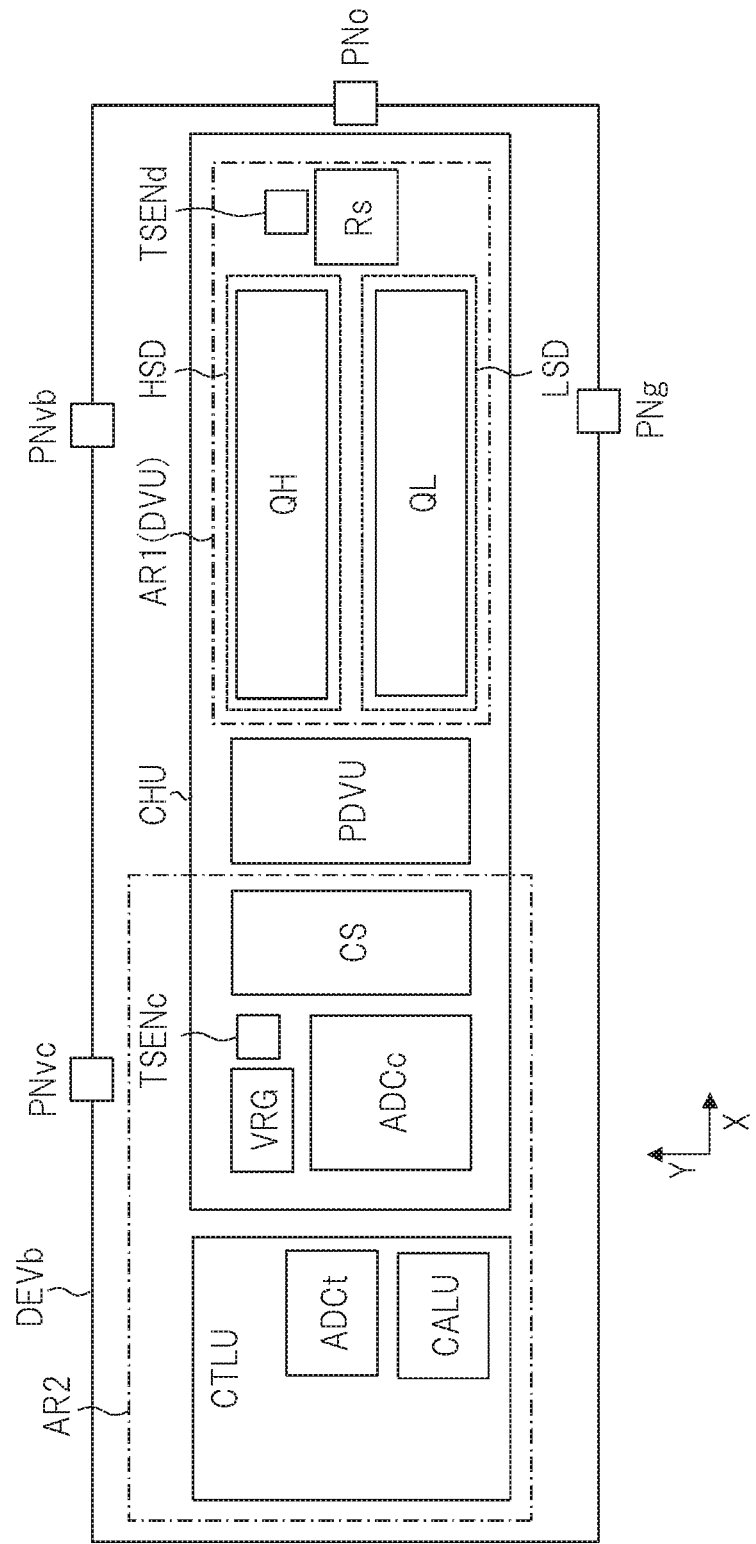
FIG. 12 is a schematic diagram illustrating an arrangement configuration example of respective circuits in a semiconductor device including the current sensing path in FIG. 11.

FIG. 12 is a schematic diagram illustrating an arrangement configuration example of respective circuits in a semiconductor device including the current sensing path in FIG. 11. In the semiconductor device (semiconductor chip) DEVb illustrated in FIG. 12, as compared to the configuration example of FIG. 5, there are differences in the driver area AR1 that the sensing transistors (QSH, QSL) are not provided and the sensing resistance element Rs and the temperature sensor TSENd are not provided in a vicinity of the output terminal PNo.

<<Main Effect of Second Embodiment>>

As described above, by using the method of the second embodiment, the same effect as the various results described in the first embodiment can be achieved.

Third Embodiment

<<Configuration of Current Sensing Method (Third Embodiment)>>

Figure 13:
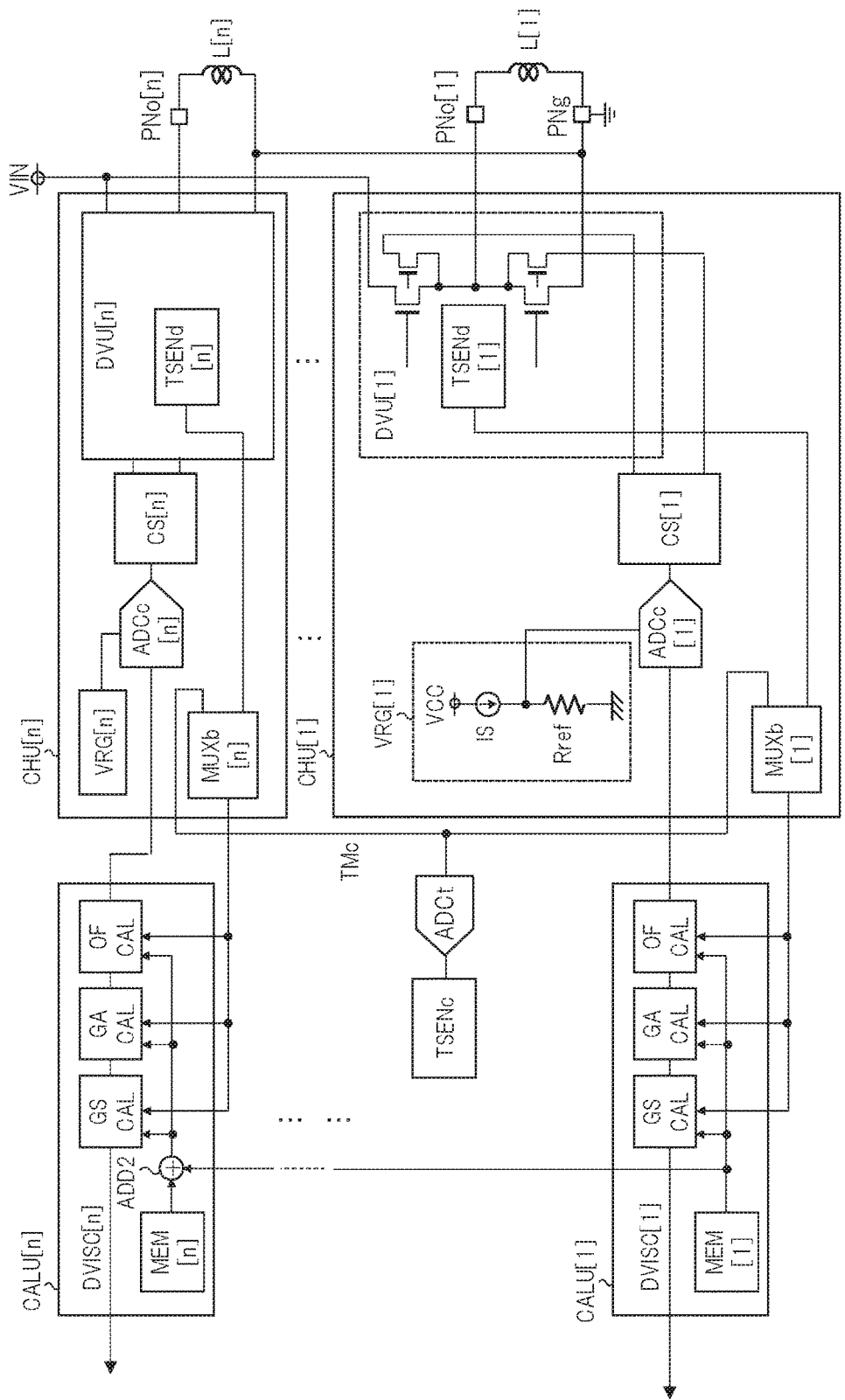
FIG. 13 is a circuit block diagram illustrating a configuration example of a current sensing path in a load drive system according to a third embodiment of the present invention.
Figure 14:
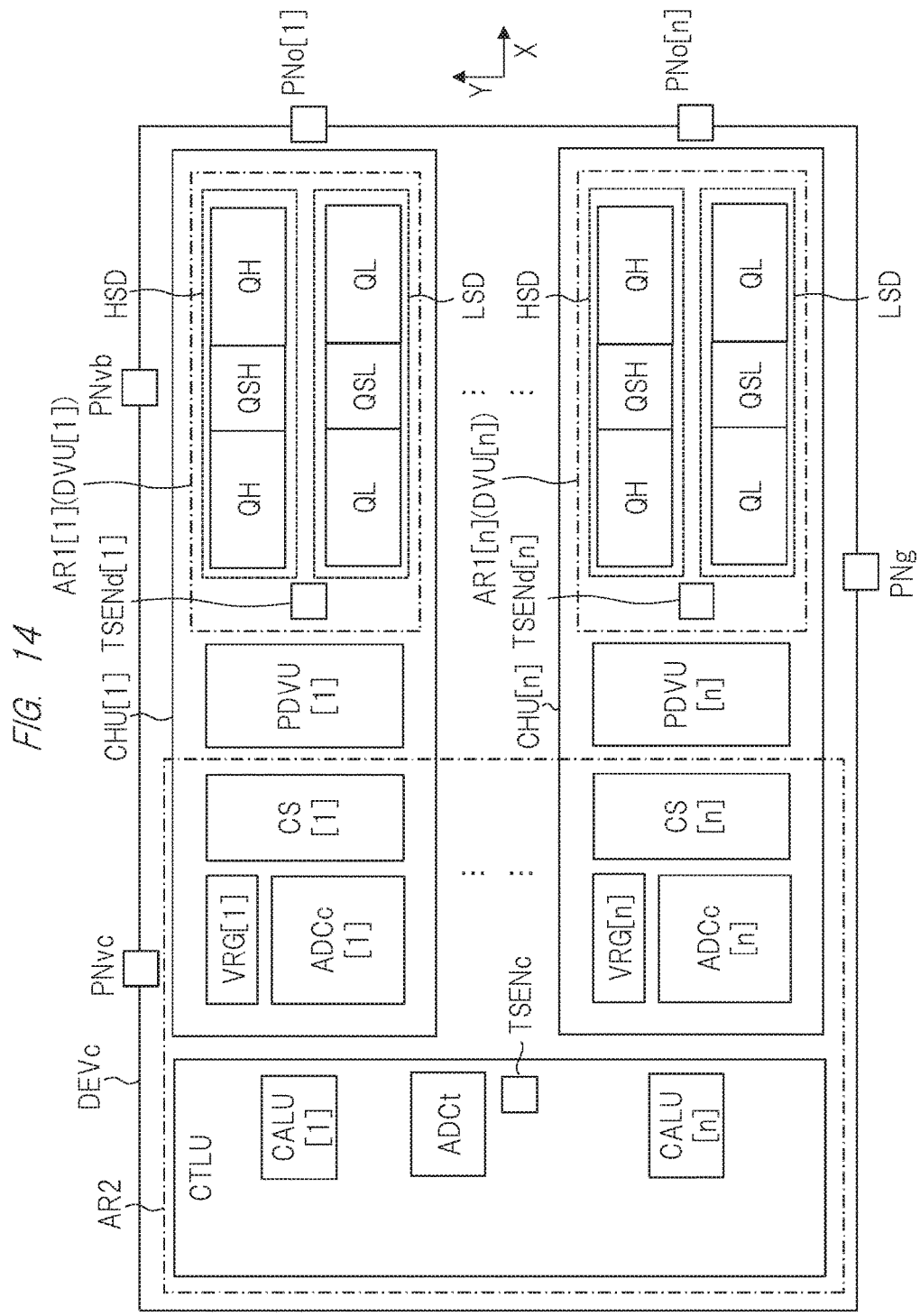
FIG. 14 is a schematic diagram of an arrangement configuration example of respective circuits in a semiconductor device including the current sensing path in FIG. 13.

FIG. 13 is a circuit block diagram illustrating a configuration example of a current sensing path in a load drive system according to a third embodiment of the present invention. FIG. 14 is a schematic diagram of an arrangement configuration example of respective circuits in a semiconductor device including the current sensing path in FIG. 13. The semiconductor device (semiconductor chip) DEVc illustrated in FIG. 14 has a configuration in which a plurality of the channel units CHU (CHU[1] to CHU[n]) illustrated in FIG. 5 are arranged along a Y direction. Corresponding to this, a plurality of output terminals PNo[1] to PNo[n], which are coupled to the plurality of inductors L[1] to L[n] respectively, are provided.

In addition, driver units DVU[1] to DVU[n] (driver area AR1[1] to AR1[n]) in the plurality of channel units CHU[1] to CHU[n] respectively include temperature sensors TSENd [1] to TSENd[n]. That is, here, as a difference from FIG. 5, each of the driver areas AR1[1] to AR1[n] includes commonalized one temperature sensor.

In the control circuit unit CTLU (peripheral circuit area AR2), a plurality of correction circuit units CALU[1] to CALU[n] are arranged in accordance with the plurality of channel units CHU[1] to CHU[n]. Further, in the control circuit unit CTLU (peripheral circuit area AR2), one temperature sensor TSENc communalized by the plurality of channel units CHU[1] to CHU[n] and the analog-digital converter ADCt are arranged. As illustrated in FIG. 13, to the selection circuits MUXb [1] to MUXb [n] included in the plurality of channel units CHU[1] to CHU[n], the temperature signal TMc from the one temperature sensor TSENc is commonly inputted. Note that, although one temperature sensor TSENc is provided here, in some cases, dependent on a temperature distribution in the peripheral circuit area AR2, a plurality of the temperature sensors TSENc may be provided.

In this manner, when mounting the plurality of channel units CHU[1] to CHU[n] in the semiconductor device (semi-conductor chip) DEVc, temperature of each of the driver areas AR1[1] to AR1[n] may vary one by one in accordance with driving states of the corresponding one of the inductors L[1] to L[n]. Therefore, the temperature sensors TSENd[1] to TSENd[n] are provided per the driver areas AR1[1] to AR1[n]. On the other hand, in an area (peripheral circuit area AR2) except for the driver areas AR1[1] to AR1[n], temperature may be approximately the same. Thus, at least one temperature sensor TSENc is provided. In this manner, by providing a minimal number of temperature sensors, an increase of area overhead can be suppressed.

In addition, as illustrated in FIG. 13, the correction circuit unit (for example, CALU[n]) corresponding to the channel units (CHU[2] (not illustrated) to CHU[n]) except for the channel unit CHU[1] includes an adder ADD2. For example, the memory circuit MEM[n] in the correction circuit unit CALU[n] retains differential correction information referring respective correction information items (offset correction information, ADC gain correction information, and sense gain correction information) retained in the memory circuit MEM[1] in the correction circuit unit CALU[1] as a reference. Using the adder ADD2, the correction circuit unit CALU[n] restores correct correction information by adding respective correction information items of the memory circuit MEM[n] to respective correction information items from the memory circuit MEM[1].

To retain respective correction information items, a memory capacity is necessary to some extent. Normally, when the number (n) of the channel unit is increased, the circuit area of the memory circuit MEM is also increased by n times, and thus an increase of area overhead may be problematic. On the other hand, differences in the respective correction information items among the plurality of channel units CHU[1] to CHU[n] are normally reduced. Here, as illustrated in FIG. 13, it is possible to suppress an increase of the area overhead by retaining differential information by respective memory circuits (MEM[2] to MEM[n]) except for one memory circuit MEM[1]. For example, when the correction factor of the memory circuit MEM[1] is "99" and a correct correction factor of the memory circuit [n] is "100," the memory circuit MEM[n] is only necessary to retain a differential value "1," and having a memory capacity about the differential value is sufficient.

<<Example of Application of Load Driving System>>

Figure 15:
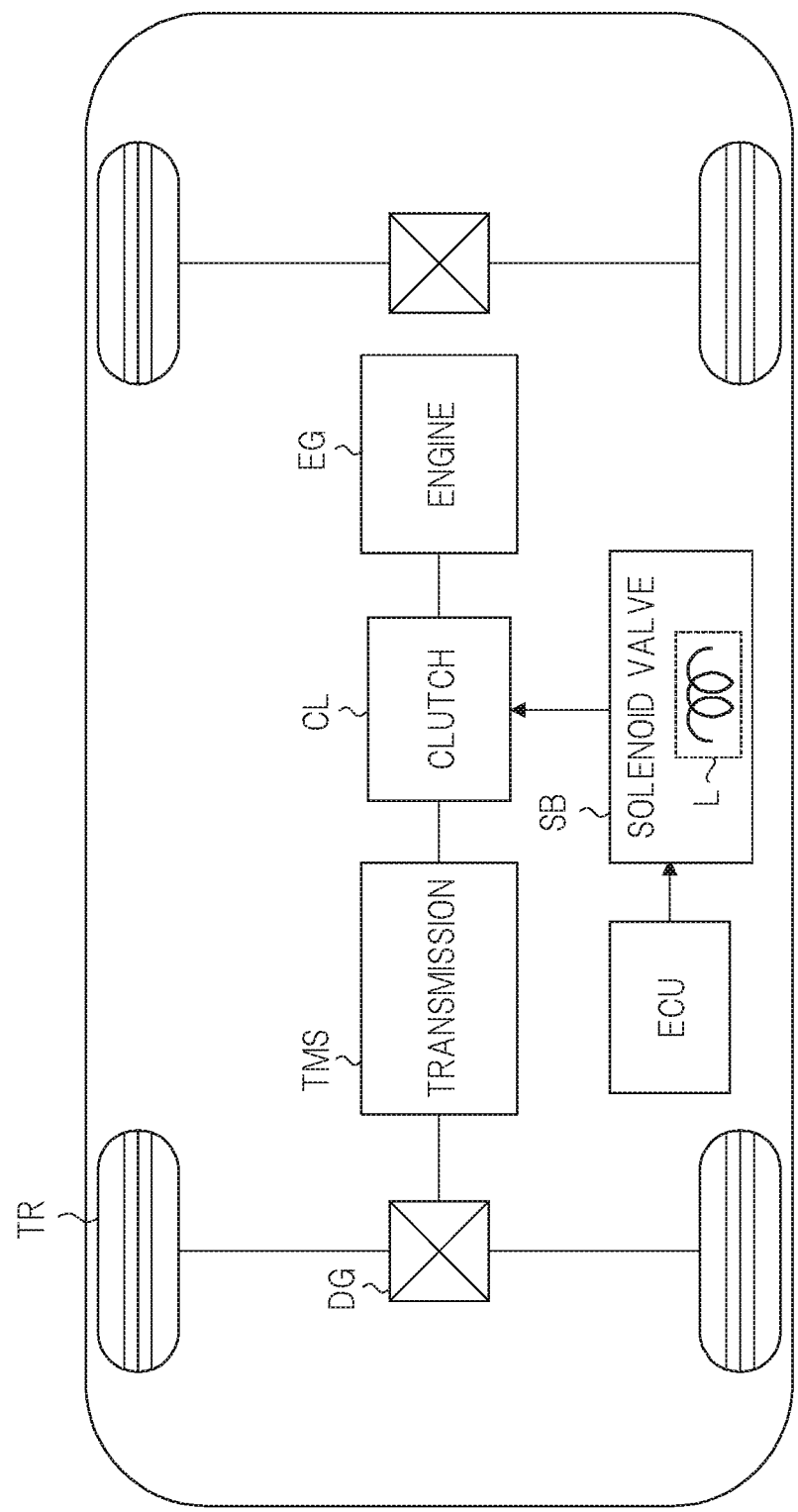
FIG. 15 is a diagram illustrating a vehicle using the load drive system according to the third embodiment of the present invention.

FIG. 15 is a diagram illustrating a vehicle using the load drive system according to the third embodiment of the present invention. The vehicle illustrated in FIG. 15 includes tires TR, a differential gear DG, a transmission TMS, a clutch CL, an engine EG, a solenoid valve SB, electronic control device ECU, etc. The solenoid valve SB includes an inductor L and controls oil pressure of the clutch CL in accordance with an inductor current flowed through the inductor L.

Figure 16:
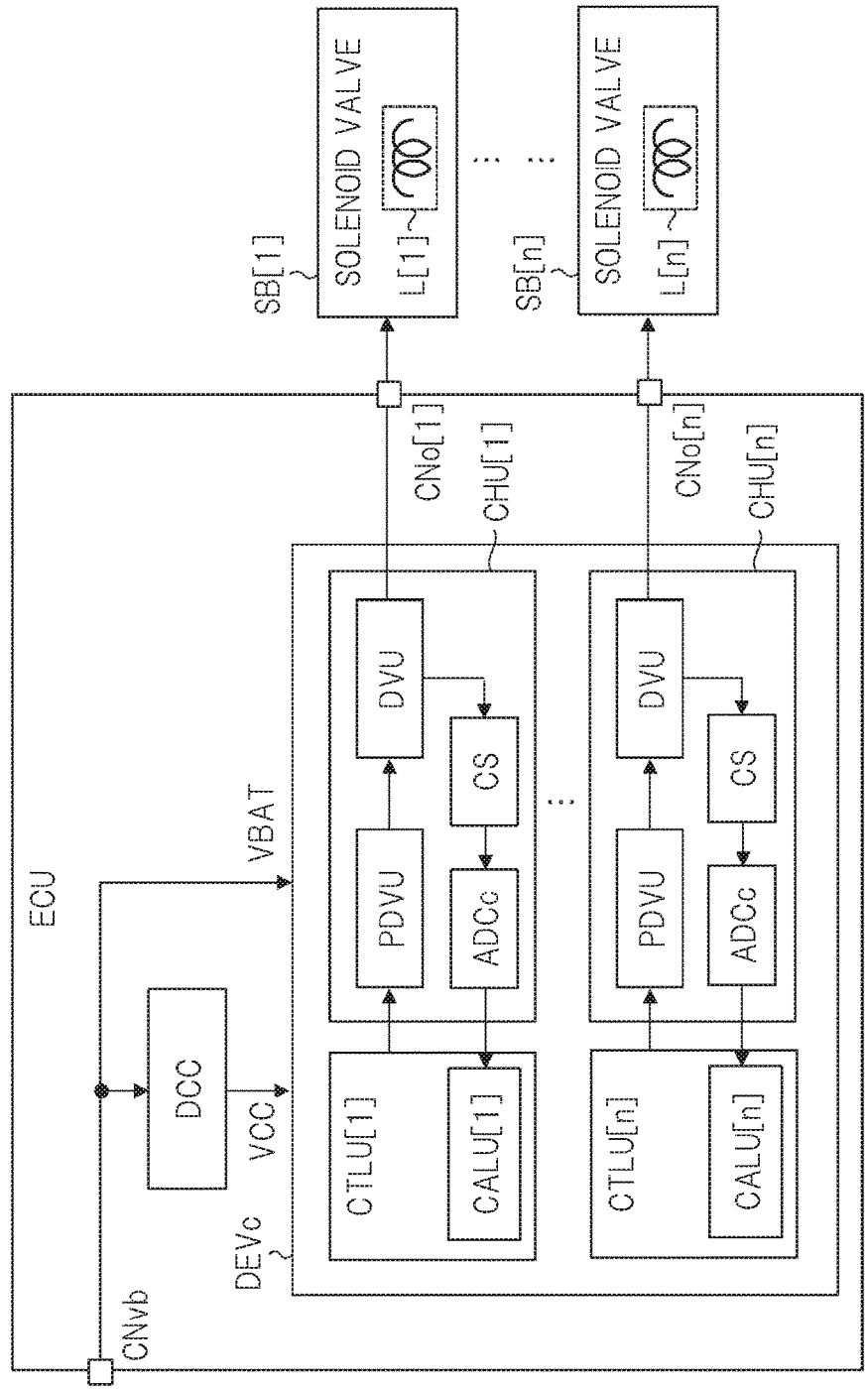
FIG. 16 is a diagram illustrating a configuration example of an electronic control device in FIG. 15.

FIG. 16 is a diagram illustrating a configuration example of the electronic control device in FIG. 15. The electronic control device ECU illustrated in FIG. 16 is configured by a wiring board on which, for example, a DC/DC converter DCC, a semiconductor device DEVc are mounted and so forth. The DC/DC converter DCC receives a battery power potential VBAT (for example, 13V etc.) from an external connector and generates a power potential VCC (for example, 3.3V etc.).

The semiconductor device DEVc has a configuration as illustrated in FIGS. 13 and 14 and is operated as it receives the battery power potential VBAT and the power potential VCC. The semiconductor device DEVc controls a current of a solenoid valve SB[1] via an external connector CNo[1] so that the corrected digital sensed voltage (that is, current of the solenoid valve SB[1]) from the correction circuit unit CALU[1] matches a target voltage (target current). In the same manner, the semiconductor device DEVc controls a current of the solenoid valve SB[n] via an external connector CNo so that a corrected digital sensed voltage (that is, a current of the solenoid valve SB[n]) from a correction circuit unit CALU[n] matches a target voltage (target current).

Figure 17:
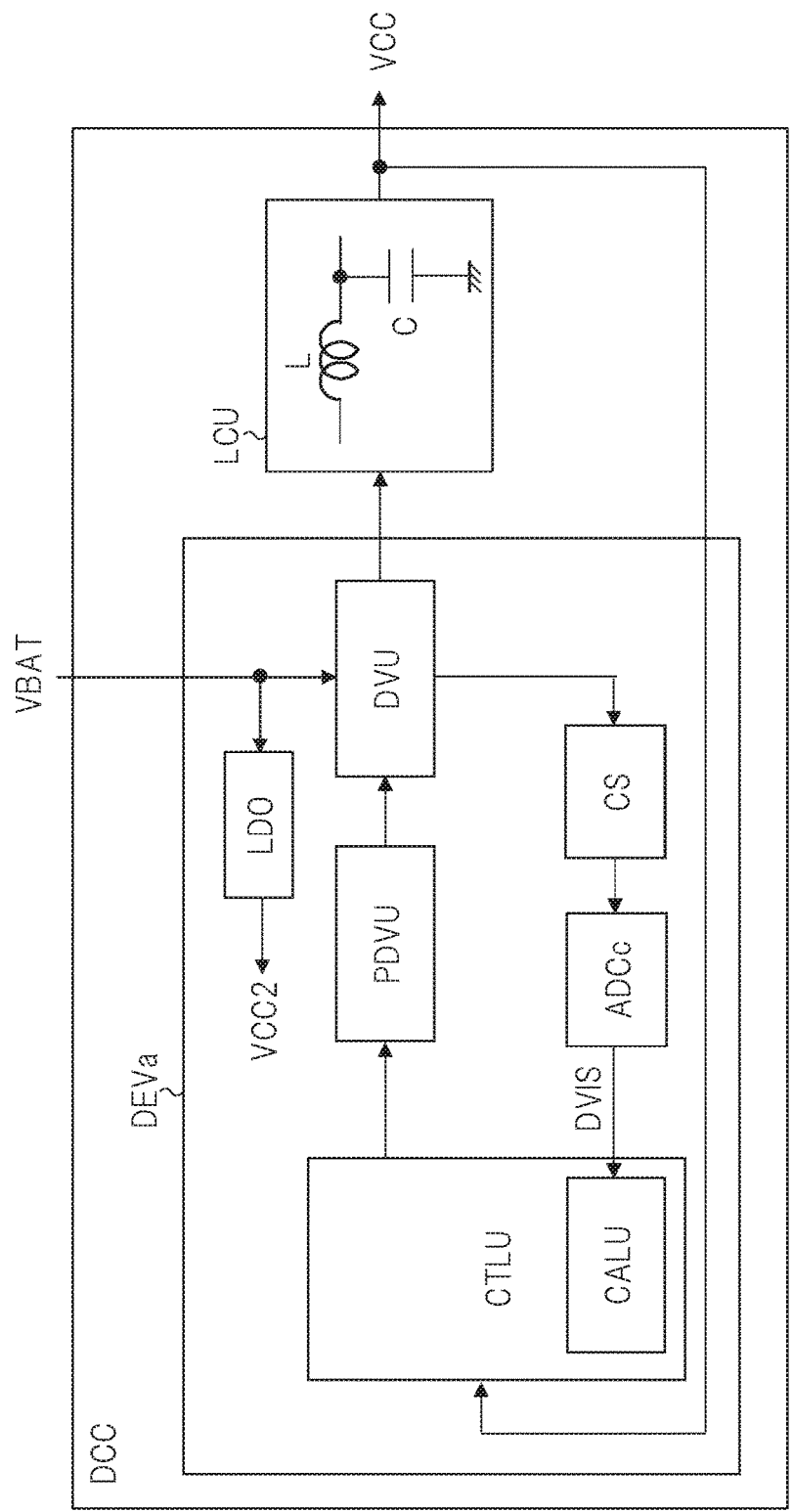
FIG. 17 is a diagram illustrating a configuration example of a DC/DC converter in FIG. 16.

FIG. 17 is a diagram illustrating a configuration example of the DC/DC converter in FIG. 16. The DC/DC converter DCC includes a semiconductor device DEVa and an LC circuit unit LCU. The LC circuit unit LCU includes an inductor and a smoothing capacitor C and outputs a power potential VCC. The semiconductor device DEVa schematically includes a configuration as illustrated in FIGS. 1, 4 and 5, and is operated as it receives a battery power potential VBAT. However, different from the case of FIG. 1, the semiconductor device DEVa controls not only an inductor current IL but also the power potential VCC finally.

The semiconductor device DEVa includes, in this example, an internal power regulator (series regulator) for generating an internal power potential VCC2 corresponding to the power potential VCC illustrated in FIG. 1. In addition, in a control circuit unit CTLU in the semiconductor device DEVa, the power potential VCC is feedback in addition to the digital sensed voltage DVIS from the analog-digital converter ADCc. The control unit CTLU includes a voltage control loop and a current control loop provided inside the voltage control loop, senses an error between the power potential VCC and a predetermined target voltage by the voltage control loop, and generates a PWM signal by inputting a result of the sensing and the corrected digital sensed voltage from the correction circuit unit CALU into the current loop.

Here, in FIG. 15, regarding automatic (AT) vehicles for example, it is desired to highly accurately control the oil pressure of the clutch CL for smooth shift transmission. To achieve it, in FIG. 16, it is required to highly accurately control current of the solenoid valves SB[1] to SB[n] and then a higher accuracy of current sensing accuracy is desired. When using the load driving system according to third embodiment, such requirements are satisfied and thus technical advancement of vehicles can be achieved.

In addition, as illustrated in FIG. 17, by using the load drive system according in the first embodiment as the DC/DC converter, feedback control can be performed using a highly accurate feedback current. As a result, for example, enhancement of control bandwidth can be achieved. Further, by using the feedback current in an overcurrent sensing etc., it is possible to provide a careful protection etc. Note that, although application examples to a solenoid valve and a DC/DC converter have been described here, it is of course not limited to these and it is widely applicable to various systems having an inductor as load represented by a motor system etc.

<<Main Effects of the Third Embodiment>>

As described above, by using the method of the third embodiment, the same effects as the various effects described in the first embodiment can be achieved. In addition, when targets to be controlled is increased, with suppressing an increase of the area overhead, desired effects can be achieved. Further, by using the method of the third embodiment especially in the current control of the solenoid valve, performance of vehicles can be enhanced.

In the foregoing, the invention made by the inventors of the present invention has been concretely described based on the embodiments. However, it is needless to say that the present invention is not limited to the foregoing embodiments and various modifications and alterations can be made within the scope of the present invention. Note that the present invention is not limited to the embodiment but various modification examples are included. For example, the embodiment has been described in detail for facilitating explanations of the present invention and thus the embodiment is not always limited to the one that includes every component of the description. In addition, apart of the components of the embodiment can be substituted by other components of another embodiment. Further, other components of another embodiment can be added to the embodiment. Moreover, a part of the components of the embodiment can be added, omitted, and/or replaced by other components.

What is claimed is:

1. A semiconductor device formed in one semiconductor chip and comprising a first area, a second area, and a correction circuit part,
   wherein a driving transistor, a current sensor, and a first temperature sensor are arranged in the first area,
      the driving transistor being coupled between a power potential and an output terminal that is coupled to an inductor to form a current path of an inductor current to flow through the inductor when the transistor is controlled to be on,
      the current sensor sensing the inductor current, and
      the first temperature sensor sensing temperature of the first area and output a first temperature signal to show the temperature,
   wherein a current sensing circuit, a first analog-digital converter, and a second temperature sensor are arranged in the second area,
      the current sensing circuit to which a sensed value of the current sensor is inputted and from which a sensed voltage corresponding to the sensed value is outputted,
      the first analog-digital converter to which the sensed voltage is inputted and from which a digital sensed voltage is outputted after digitally converting the sensed voltage according to a reference value applied as a scale mark, and
      the second temperature sensor sensing temperature of the second area and outputting a second temperature signal showing the temperature, and
   wherein the correction circuit part corrects the digital sensed voltage based on the first temperature signal and the second temperature signal.

2. The semiconductor device according to claim 1,
   wherein the correction circuit part comprises:
   a memory circuit preliminarily retaining first information showing a temperature dependency of the sensed value of the current sensor and second information showing a temperature dependency of an input-output gain of the first analog-digital converter;
   a first correction circuit correcting the digital sensed voltage based on the first temperature signal and the first information; and
   a second correction circuit correcting the digital sensed voltage based on the second temperature signal and the second information.

3. The semiconductor device according to claim 2,
   wherein the current sensor is formed of a sensing resistance element coupled to the inductor in series.

4. The semiconductor device according to claim 2,
   wherein the current sensor has a predetermined size ratio when compared to the driving transistor and formed of a sensing transistor controlled to be turned on and off commonly with the driving transistor.

5. The semiconductor device according to claim 4, wherein, arranged in the first area are:
a high-side transistor that is one of the driving transistors and coupled between the output terminal and a high-potential power potential;
a low-side transistor that is the other one of the driving transistors and coupled between the output terminal and a low-potential power potential;
a high-side sensing transistor that is one of the sensing transistors and provided corresponding to the high-side transistor;
a low-side sensing transistor that is the other one of the sensing transistor and provided corresponding to the low-side transistor; and
two first temperature sensors, and
wherein one of the two first temperature sensors senses temperature of the high-side sensing transistor, and the other one of the two first temperature sensors senses temperature of the low-side sensing transistor.

6. The semiconductor device according to claim 2, wherein the memory circuit further retains third information showing a temperature dependency of the current sensing circuit or an offset voltage of the first analog-digital converter, and
the correction circuit part further includes a third correction circuit correcting the digital sensed voltage based on the second temperature signal and the third information.

7. The semiconductor device according to claim 1, further comprising:
a selection circuit selecting the first temperature signal or the second temperature signal; and
a second analog-digital converter converting temperature signal from the selection circuit into a digital signal.

8. The semiconductor device according to claim 2, wherein a number of the first areas in which the current sensor and the first temperature sensor are arranged is n that is an integer number larger than or equal to 2,
a number of the current sensing circuits and the first analog-digital converters arranged in the second area is n and a number of the second temperature sensor arranged in the second area is at least one, and
a number of the correction circuit parts provided is n.

9. The semiconductor device according to claim 8, wherein the memory circuit of an n-th one of the correction circuit parts retains information of a difference based on the first information and the second information retained in the memory circuit in a first one of the correction circuit parts.

10. A load drive system comprising:
an inductor to be a load coupled to an output terminal; and
a semiconductor device formed of one semiconductor chip and including a first area, a second area, and a correction circuit part,
wherein a driving transistor, a current sensor, and a first temperature sensor are arranged in the first area,
the driving sensor being coupled between the output terminal and a power potential and forming a current oath of an inductor current to flow in the inductor when it is controlled to be on,
the current sensor sensing the inductor current, and
the first temperature sensor sensing a temperature of the first area and outputting a first temperature signal showing the temperature,
wherein a current sensing circuit, a first analog-digital converter, and a second temperature sensor are arranged in a second area,
the current sensing circuit to which a sensed value of the current sensor is inputted and from which a sensed voltage corresponding to the sensed value is outputted,
the first analog-digital converter to which the sensed value is inputted and from which a digital sensed voltage is outputted by digitally converting the sensed voltage according to a reference value applied as a scale mark, and
the second temperature sensor sensing a temperature of the second area and outputting a second temperature signal showing the temperature, and
wherein the correction circuit unit corrects the digital sensed voltage based on the first temperature signal and the second temperature signal.

11. The load driving system according to claim 10, wherein the correction circuit unit includes:
a memory circuit preliminarily retaining first information showing a temperature dependency of the sensed value of the current sensor and second information showing a temperature dependency of an input-output gain of the first analog-digital converter;
a first correction circuit correcting the digital sensed voltage based on the first temperature signal and the first information; and
a second correction circuit correcting the digital sensed voltage based on the second temperature signal and the second information.

12. The load driving system according to claim 11, wherein the current sensor is formed of a sensor resistance element coupled to the inductor in series or a sensing transistor having a predetermined size ratio when compared to the driving transistor and controlled to be on and off commonly with the driving transistor.

13. The load driving system according to claim 11, wherein the memory circuit further retains third information showing a temperature dependency of the current sensing circuit or an offset voltage of the first analog-digital converter, and
the correction circuit part further includes a third correction circuit correcting the digital sensed voltage based on the second temperature signal and the third information.

14. The load driving circuit according to claim 11, wherein a number of the first areas in which the current sensor and the first temperature sensor are arranged is n that is an integer number larger than or equal to 2,
a number of the current sensing circuits and the first analog-digital converters arranged in the second area is n and a number of the second temperature sensor arranged in the second area is at least one, and
a number of the correction circuit parts provided is n.

15. The load driving system according to claim 14, wherein the memory circuit of an n-th one of the correction circuit parts retains information of a difference based on the first information and the second information retained in the memory circuit in a first one of the correction circuit parts.

16. The load driving system according to claim 10, wherein the inductor is included in a solenoid valve.

17. A method of sensing current of an inductor current using a load driving system including an inductor in which the inductor current flows to be a load coupled to an output terminal and a semiconductor device formed of one semiconductor chip and including a first area and a second area,
  wherein a driving transistor, a current sensor, and a first temperature sensor are arranged in the first area,
    the driving transistor being coupled between a power potential and an output terminal that is coupled to an inductor to form a current path of an inductor current to flow through the inductor when the transistor is controlled to be on,
    the current sensor sensing the inductor current, and
    the first temperature sensor sensing temperature of the first area and output a first temperature signal to show the temperature,
  wherein a current sensing circuit, a first analog-digital converter, and a second temperature sensor are arranged in the second area,
    the current sensing circuit to which a sensed value of the current sensor is inputted and from which a sensed voltage corresponding to the sensed value is outputted, and
    the first analog-digital converter to which the sensed voltage is inputted and from which a digital sensed voltage is outputted by digitally converting the sensed voltage according to a reference value applied as a scale mark, and
  wherein the semiconductor device carries out:
  a first step of sensing temperature of the first area and the second area, respectively, and
  a second step of correcting the digital sensed voltage based on the temperature of the first area and the temperature of the second area.

18. The method of sensing current of an inductor current according to claim 17,
  wherein the semiconductor device preliminarily retains:
    first information showing a temperature dependency of the sensed value of the current sensor; and
    a second information showing a temperature dependency of an input-output gain of the first analog-digital converter, and
  wherein, in the second step, the method carries out:
  a third step of correcting the digital sensed value based on the temperature of the first area and the first information; and
  a fourth step of correcting the digital sensed voltage based on a temperature of the second area and the second information.

19. The method of sensing current of an inductor current according to claim 18,
  wherein the semiconductor device retains third information showing a temperature dependency of an offset voltage of the current sensing circuit or the first analog-digital converter, and
  wherein the semiconductor device carries out a fifth step of correcting the digital sensed voltage based on the temperature of the second area and the third information in the second step.

20. The method of sensing current of an inductor current according to claim 19,
  wherein the second information is defined by carrying out a first test observing the reference value applied to the first analog-digital converter with changing the temperature, and
  wherein the first and third information is defined by carrying out a second test observing the digital sensed voltage corrected in the fourth step with changing temperature and a test load current applied to the output terminal respectively while the fourth step is enabled.

* * * * *